US008603725B2

(12) United States Patent
Landry-Coltrain et al.

(10) Patent No.: US 8,603,725 B2
(45) Date of Patent: Dec. 10, 2013

(54) LASER-ENGRAVEABLE COMPOSITIONS AND FLEXOGRAPHIC PRINTING PRECURSORS

(75) Inventors: Christine Joanne Landry-Coltrain, Fairport, NY (US); Mridula Nair, Penfield, NY (US)

(73) Assignee: Eastman Kodak Company, Rochester, NY (US)

( * ) Notice: Subject to any disclaimer, the term of this patent is extended or adjusted under 35 U.S.C. 154(b) by 179 days.

(21) Appl. No.: 13/192,531

(22) Filed: Jul. 28, 2011

(65) Prior Publication Data
US 2013/0029102 A1    Jan. 31, 2013

(51) Int. Cl.
G03C 1/00 (2006.01)
G03C 1/035 (2006.01)
G03G 5/00 (2006.01)
G03G 13/26 (2006.01)

(52) U.S. Cl.
USPC ............................. 430/270.1; 430/56; 430/96

(58) Field of Classification Search
USPC .......................................... 430/56, 96, 270.1
See application file for complete search history.

(56) References Cited

U.S. PATENT DOCUMENTS

| | | | |
|---|---|---|---|
| 4,060,032 A | 11/1977 | Evans | |
| 4,943,467 A | 7/1990 | Shuji | |
| 6,090,529 A | 7/2000 | Gelbart | |
| 6,159,659 A | 12/2000 | Gelbart | |
| 6,776,095 B2 | 8/2004 | Telser et al. | |
| 6,816,146 B2* | 11/2004 | Harada et al. | 345/107 |
| 6,989,220 B2* | 1/2006 | Kanga | 430/14 |
| 7,029,825 B2* | 4/2006 | Yokota et al. | 430/281.1 |
| 7,754,415 B2* | 7/2010 | Yamada et al. | 430/300 |
| 7,811,744 B2* | 10/2010 | Figov | 430/306 |
| 8,114,572 B2* | 2/2012 | Landry-Coltrain et al. | 430/270.1 |
| 2002/0123003 A1* | 9/2002 | Kannurpatti et al. | 430/270.1 |
| 2003/0129530 A1* | 7/2003 | Leinenbach et al. | 430/270.1 |
| 2003/0148073 A1* | 8/2003 | Landry-Coltrain et al. | 428/195 |
| 2005/0227165 A1* | 10/2005 | Yamada et al. | 430/270.1 |
| 2007/0178408 A1* | 8/2007 | Yamada et al. | 430/300 |
| 2008/0076061 A1* | 3/2008 | Figov | 430/270.1 |
| 2008/0258344 A1* | 10/2008 | Regan et al. | 264/400 |
| 2008/0261028 A1 | 10/2008 | Regan et al. | |
| 2010/0021842 A1* | 1/2010 | Kanga | 430/270.1 |
| 2012/0240802 A1* | 9/2012 | Landry-Coltrain et al. | 101/483 |
| 2013/0029103 A1* | 1/2013 | Landry-Coltrain et al. | 428/159 |
| 2013/0029155 A1* | 1/2013 | Nair | 428/407 |

FOREIGN PATENT DOCUMENTS

EP    1 424 210    6/2004

OTHER PUBLICATIONS

U.S. Appl. No. 13/053,700, filed Mar. 22, 2011 entitled Laser-Engraveable Flexographic Printing Precursors by Landry-Coltrain et al.
U.S. Appl. No. 13/192,533, titled Laser-Engraveable Compositions and Flexographic Printing Precursors filed Jul. 28, 2011 by Landry-Coltrain et al.
U.S. Appl. No. 13/192,541, titled "Preparation of Crosslinked Organic Porous Particles" filed Jul. 28, 2011 by Nair.
U.S. Appl. No. 13/192,544, titled "Article and System With Crosslinked Organic Porous Particles" filed Jul. 28, 2011 by Nair et al.
U.S. Appl. No. 13/192,521, titled "Crosslinked Organic Porous Particles" filed Jul. 28, 2011 by Nair.

* cited by examiner

Primary Examiner — Hoa (Holly) Le
(74) Attorney, Agent, or Firm — J. Lanny Tucker

(57) ABSTRACT

Flexographic printing precursors are prepared using laser-engraveable compositions containing a laser-engraveable resin and chemically-crosslinked organic porous particles. The presence of these porous particles, which can include an infrared radiation absorber, improves various imaging and performance properties in the preparation of flexographic printing members such as flexographic printing plates and printing sleeves.

28 Claims, No Drawings

US 8,603,725 B2

LASER-ENGRAVEABLE COMPOSITIONS AND FLEXOGRAPHIC PRINTING PRECURSORS

RELATED APPLICATIONS

Copending and commonly assigned U.S. Ser. No. 13/192,533, filed Jul. 28, 2011 by Landry-Coltrain and Nair, and entitled LASER-ENGRAVEABLE COMPOSITIONS AND FLEXOGRAPHIC PRINTING PRECURSORS.

Copending and commonly assigned U.S. Ser. No. 13/192,521, filed Jul. 28, 2011 by Nair and entitled CROSSLINKED ORGANIC POROUS PARTICLES AND ARTICLES PREPARED THEREFROM.

Copending and commonly assigned U.S. Ser. No. 13/192,541, filed Jul. 28, 2011 by Nair and entitled PREPARATION OF CROSSLINKED ORGANIC POROUS PARTICLES.

Copending and commonly assigned U.S. Ser. No. 13/192,544, filed Jul. 28, 2011 by Nair and entitled ARTICLE AND SYSTEM WITH CROSSLINKED ORGANIC POROUS PARTICLES.

FIELD OF THE INVENTION

This invention relates to laser-engraveable compositions and flexographic printing precursors that can be prepared using the compositions. This invention also relates to imaging of the flexographic printing precursors to prepare flexographic printing members such as flexographic printing plates and printing cylinders. Moreover, the invention provides systems for laser-engraving and methods for flexographic printing.

BACKGROUND OF THE INVENTION

Flexographic printing plates are sometimes known as "relief printing plates" and are provided with raised relief images onto which ink is applied for application to the printing substance. Flexographic printing plates generally have a rubbery or elastomeric nature. Flexographic printing plates have been imaged in a number of ways. A common method of imaging the plate is to prepare the relief images by exposing photosensitive compositions coated on a substrate through a masking element or transparency and then removing non-exposed regions of the coating with a suitable solvent. The remaining exposed areas are not removed due to the crosslinking of the photosensitive composition that renders these areas insoluble in the wash (or developing) solvents. These remaining areas provide the image areas to be inked and constitute the working part of the flexographic printing plate. Flexographic printing can also be carried out using a flexographic printing cylinder or seamless sleeve having the desired raised relief image. With the recent availability of high power lasers, such as $CO_2$ lasers and IR laser diodes, it is now possible to use such lasers to formulate flexographic printing plate precursors that can be directly engraved to provide the desired relief surface necessary for flexographic printing. This is known as "direct laser engraving" and provides advantages by eliminating the need for a negative or a photomask to make the flexographic printing plate and eliminating the use of solvent processing.

The non-printing wells in the relief of a flexographic printing plate are at least 0.05 mm in depth in the screen areas, and can assume values up to 3 mm in other imaged areas in the case of thick flexographic printing plates or other flexographic printing members. Thus, large amounts of material must be removed, for example, by means of the laser. Direct laser engraving therefore differs very substantially in this respect from other techniques known from the printing plate sector, in which lasers are used only for imaging thin layers such as for a lithographic printing plate or a mask that is used over a photopolymer flexographic plate, for which the actual production of the flexographic printing plate is still effected by means of a washout and development process.

Various vulcanized thermoplastic elastomeric materials and olefinic polymers have been described for use as binders in laser-engraveable layers in flexographic printing element precursors. For example, U.S. Pat. No. 6,776,095 (Telser et al.) describes using a two-step crosslinking process and various thermoplastic elastomer block copolymers to provide laser-engravable flexographic printing plate precursors. The thermoplastic elastomers can be styrene-butadiene and styrene-isoprene block copolymers that are used in combination with suitable crosslinking chemistry.

Particulate materials such as inorganic fillers and organic particles have been added to elastomeric compositions used in laser-engraveable (or laser-ablatable) compositions to improve engraveability. Voids can also be provided in such compositions for the same purpose. For example, U.S. Pat. No. 6,159,659 (Gelbart) describes a flexographic printing plate that has an elastomeric non-porous top layer and a porous laser ablatable layer under the top layer. The laser ablatable lower layer contains voids that can be created by incorporating glass particles or plastic micro-balloons for example commercially available Expancel® beads that have a size of about 50-100 µm.

Similarly, U.S. Pat. No. 6,090,529 (Gelbart) describes a structure in which the porous layer is a foamed layer or can contain micro-balloons, and further describes a method to create the recessed image areas by using a lower power laser that melts and shrinks the porous layer in specific areas rather than ablating it.

U.S. Pat. No. 6,989,220 (Kanga) describes a method of making an imaged relief plate by providing a collapsible curable layer containing microspheres. The microspheres can be either expanded or unexpanded microspheres having a thermoplastic shell containing a hydrocarbon liquid (for example, Expancel® beads) having sizes in the range of 6 µm to 40 µm.

U.S. Pat. No. 4,060,032 (Evans) describes a multilayered composite plate with low density that can be achieved by incorporating expandable micro-capsules made of a thermoplastic shell of poly(vinylidene chloride-co-acrylonitrile) and a nucleus of a liquefied blowing agent in specified polymer binders. The microcapsules can be expanded during flexographic printing plate manufacturing. The resulting foam cell size in the imageable layer ranges from 14 to 20 µm.

U.S. Patent Application Publication 2008/0261028 (Regan et al.) describes laser-ablatable compositions and printing plate precursors that include various elastomeric resins and inorganic or organic particles.

Copending and commonly assigned U.S. Ser. No. 13/053,700 (filed Mar. 22, 2011 by Landry-Coltrain and Franklin) describes laser-engraveable layer containing nanocrystalline polyolefins and optionally chemically inactive particles or microcapsules to reinforce the mechanical properties of the material, increase the hardness of the material, or decrease the tackiness of the material and ablation debris, enabling easier debris collection and improving the cleanliness of the laser-engraved member. Inactive inorganic particles include various inorganic filler materials, inactive microcapsules such as those described in the publications cited above. Inactive microspheres can be hollow or filled with an inactive solvent, and facilitate engraving in the laser-engraveable layer because they reduce the energy needed for engraving. Useful inactive microspheres can be formed of an inorganic glass material such as silicon oxide glass, a magnesium silicate glass, or an inactive thermoplastic polymeric shell material such as a styrene or acrylate copolymer or a vinylidene chloride copolymer.

Still other useful nanocrystalline polyolefins can be prepared using synthetic procedures as described for example in U.S. Pat. Nos. 6,930,152 Hashimoto et al.) and 7,253,234 (Mori et al.) and U.S. Patent Application Publication 2008/0220193 (Tohi).

A significant problem is encountered, however, by using known organic porous materials such as plastic micro-balloons, expandable microspheres, and microcapsules, in that they are all made of a thermoplastic shell that is not crosslinked. This property results in the deformation and collapse of the microcapsules and a consequent loss of their porosity during a manufacturing processing step typically used to fabricate flexographic plate precursors. Typical melt processing steps include melt mixing and melt extrusion at elevated temperatures. In addition, in manufacturing processes using organic solvent coating, the microcapsules would potentially dissolve in the organic solvent, resulting in a loss of porosity and thus restricting the choice of organic solvents that could be used to manufacture the flexographic printing plate precursors.

While the known laser-engraveable compositions can be used with the known particulate materials, there is a need to improve the particulate materials so that imaging speed is increased to increase printing precursor throughput, and to improve melt processability. These properties are not readily achieved using organic particles known in the art. It would also be useful to have organic porous particulate materials having two or more discrete pores into which various radiation absorbers can be incorporated if desired.

SUMMARY OF THE INVENTION

The present invention provides a laser-engraveable composition comprising a laser-engraveable resin having dispersed therein, chemically-crosslinked organic porous particles.

This invention also provides a laser-engravable flexographic printing precursor for providing a relief image, the precursor comprising at least one relief-forming, laser-engravable layer that comprises a laser-engraveable resin having dispersed therein, chemically-crosslinked organic porous particles.

Other embodiments of this invention include a patternable material comprising a relief-forming, laser-engravable layer that comprises a laser-engraveable resin having dispersed therein, chemically-crosslinked organic porous particles and an infrared radiation absorber.

A method of this invention for providing a relief image in a flexographic printing member by laser engraving, comprises imagewise exposing the laser-engravable flexographic printing precursor of this invention to laser-engraving radiation to provide a flexographic printing member with a relief image having a maximum dry depth of at least 50 and up to and including 1000 µm.

A flexographic printing member is also provided by this invention. This flexographic printing member is provided by the method of this invention, and the flexographic printing member comprises a relief image in a laser-engraved layer comprising a laser-engraveable resin having dispersed therein, chemically-crosslinked organic porous particles.

This invention also provides a process of flexographic printing comprising:
    imagewise exposing the laser-engravable flexographic printing precursor of this invention to laser-engraving radiation to provide a flexographic printing member having a relief image, and
    using the flexographic printing member for flexographic printing.

Further, a system for laser-engraving a flexographic printing plate precursor to form a flexographic printing member, comprises:
    the laser-engravable flexographic printing precursor of this invention for providing a relief image, and
    one or more laser-engraving radiation sources that are directed to provide laser engraving of the laser-engraveable layer.

The present invention provides a number of advantages from the use of chemically-crosslinked organic porous particles in the laser-engraveable layer that is used to form a relief image. These advantages include improved ablation or engraving speed (imaging speed) to provide increased imaging throughput, and improved melt processability and latitude in the manufacturing of the flexographic printing member precursors, such as by melt processing. The present invention also provides the advantage that flexographic printing plate precursors can be manufactured in a traditional vulcanized rubber manufacturing scheme, or they can be manufactured by melt compounding and extruding a thermoplastic elastomeric resin. Another advantage is that the invention provides improved recyclability for the flexographic printing plates if the polymeric binder used in combination with the chemically-crosslinked organic porous particles is not further chemically crosslinked. Still another advantage is that this invention provides an increase in resistance to organic solvents used in plate cleaning solutions and solvent-based flexographic printing inks.

DETAILED DESCRIPTION OF THE INVENTION

Definitions

The following definitions identify various terms and phrases used in this disclosure to define the present invention. Unless otherwise noted, these definitions are meant to exclude other definitions of the terms or phrases that can be found in the prior art.

The term "thermoplastic elastomer" or TPE refers to a polymer (homopolymer or copolymer) that exhibits both thermoplastic and elastomeric properties. While most elastomers are thermosets, thermoplastic elastomers exhibit rubber elasticity at ambient temperature and are fluidized by heating and thus are relatively easy to use in manufacturing, for example, by injection molding and extrusion. The principal difference between thermoset elastomers and thermoplastic elastomers is the type of crosslinking bond in their structures. The crosslink in thermoset polymers is a covalent bond created by a chemical reaction. On the other hand, the crosslink in a thermoplastic elastomer is created by a physical association that takes place in one of the phases of the material and is termed a physical crosslink. This physical association can be disrupted, for example by heating and will reform upon cooling. It is therefore reversible.

The term "chemical crosslinking" refers to the instance when components of a composition are crosslinked by chemical bonds resulting from a chemical reaction that is initiated by heat, pressure, change in pH, or exposure to actinic radiation. Chemical crosslinks are bonds that link one polymer chain to another and involve joining together two or more polymer molecules with chemical or covalent bonds that are strong. Chemical crosslinking results in a rapid increase in molecular weight and a corresponding increase in melt viscosity. These crosslinks promote a difference in the physical properties of the polymeric material. When a polymer is said to be "crosslinked", it usually means that the entire bulk of the polymer has been exposed to a crosslinking method. Crosslinking can also be induced in materials that are normally thermoplastic through exposure to a radiation source, such as an electron beam, gamma-radiation, or UV light. The crosslinking reaction can be thermally induced, for example as in the formation of thermosetting elastomers, such as urethanes or epoxy resin, or in the reaction of compounds containing multiple ethylenically unsaturated groups, such as acrylates, or in the vulcanization of rubbers using either sulfur-containing or peroxide curing agents, or it can be photochemically induced, for example as in the reaction of acrylates containing multiple ethylenically unsaturated groups, or by the way of free-radical initiated reactions. The chemical process of vulcanization is a type of chemical crosslinking and it changes the property of rubber. This process is often called sulfur curing but can also be accomplished using peroxides.

Crosslinks are the characteristic property of a thermoset material. Chemical covalent crosslinks are stable mechanically and thermally so once formed, chemical covalent crosslinks are difficult to break. In general, chemical crosslinking is irreversible, and the resulting thermosetting material will degrade or burn if heated, without melting. Once a polymeric substance is chemically crosslinked, the product is very difficult or impossible to melt and recycle. Specific chemical treatments and procedures are necessary to recover the starting materials. Thus, crosslinked polymers lose their thermoplastic properties and are no longer melt-processable. This renders the melt processing equipment, such as extruders, injection molding devices, and calendering devices, unsuitable for processing these materials. A crosslinked polymer or organic particle will form a polymer network that will not dissolve in an organic solvent.

Chemical crosslinking often requires the use of a reagent that causes crosslinking, such as a catalyst, a free-radical or acid-generating initiator, a photoinitiator, combinations of these or a polyfunctional compound. A reagent that causes crosslinking is a substance that promotes or regulates intermolecular covalent bonding between polymer chains, linking them together to create a more rigid structure. Thus, in general, a precursor composition that is free of reagents that cause chemical crosslinking in combination with a species that can be crosslinked will result in a plate that is free of chemical crosslinking Furthermore, a precursor composition that is free of reagents that cause chemical crosslinking will not be photosensitive so as to be susceptible to photochemical crosslinking.

In the chemically-crosslinked organic porous particles used in the practice of this invention, one or more polyfunctional reactive compounds that act as crosslinking agents are used to prepare the crosslinked solid polymer phase. Polyfunctional reactive compounds can be polyunsaturated compounds including both prepolymers and ethylenically unsaturated polymerizable monomers capable of chain growth polymerization with reagents that cause crosslinking such as azo compounds or peroxides that are free radical initiators, and can also be reactive polymers such as those with carboxylic acid groups that are capable of step growth reactions with reagents that cause crosslinking such as polyfunctional aziridines or polyfunctional glycidyl compounds.

Although the chemically-crosslinked organic porous particles of this invention are crosslinked and form an internal network within the discrete particles, they can be melt-processed in a composition that comprises a melt-processable polymer or binder.

The term "physical crosslinking" refers to thermoplastic elastomers (TPE) that have physical crosslinks forming a physical network structure in the polymer microstructure to achieve stability. With respect to the molecular structure, the TPE comprises a soft segment phase that has a glass transition temperature lower than the use temperature and a hard segment that prevents plastic deformation around ambient or use temperature. Examples of the hard segment include, but are not limited to, a phase that has a glass transition temperature higher than the use temperature, a crystalline phase, a hydrogen bond, or an ionic phase. The hard phase provides physical crosslinking or a physical network structure that is generally reversible, so they can be formed and reformed, for example, by heat processing control. The "association/de-association temperature" is defined as the temperature at which the material changes from having a physical crosslinked or network structure to material that flows and behaves as a non-crosslinked material as described above. In general, polymers that contain physical crosslinking are readily melt-processable.

The term "elastomeric" refers to a material that is an elastomer. An elastomer is typically a polymer or resin that is crosslinked, either chemically or physically, and exists above its glass transition temperature, so that it has a notably low Young's modulus and a high yield strain and elongation to break compared with other materials. An elastomeric material can undergo significant elongation without breaking and will return reversibly to its original form after the force is removed.

The term "melt processable" in the context of a thermoplastic elastomer refers to a material that can exhibit melt flow behavior, as defined above, at temperatures above the melting temperature or the association/de-association temperature. Thus, a material that is chemically crosslinked (as defined above) will not be melt processable.

The term "flexographic printing precursor" refers to an article or element of this invention that can be used to prepare a flexographic printing member of this invention and can be in the form of flexographic printing plate precursors, flexographic printing cylinder precursors, or flexographic printing sleeve precursors.

The term "flexographic printing member" refers to articles of the present invention that are imaged flexographic printing precursors and can be in the form of a printing plate having a substantially planar elastomeric outermost surface, or a printing cylinder or seamless printing sleeve having a curved elastomeric topmost surface. The flexographic printing member has a relief image in the outermost surface (that is, the laser-engraved layer).

The term "patternable material" refers to the various articles of this invention that include but are not limited to, flexographic printing precursors, mask elements, photoresists, patterned dielectrics, patterned 3-dimensional structures, patterned barrier films, patterned molds including those for embossing and nanoimprinting applications, patterned microfluidic devices or structures, and lithographic plates or precursors. Such articles can be provided in any form, shape, or size, with or without a substrate.

The term "receiver element" refers to any material or substrate that can be printed with ink using a flexographic printing member of this invention.

The term "laser imaging" refers to laser engraving, 'imaging' refers to the ablation of the background areas leaving intact the areas of the plate which will be inked up and printed by flexography.

The term "laser-engraveable" relates to a composition or layer that can be imaged using a suitable laser that produces heat within the composition or layer that causes rapid local changes in the composition or layer so that the imaged regions are physically detached and ejected from the rest of the composition or layer and appropriately collected. The breakdown is a violent process that includes eruptions, explosions, tearing, decomposition, volatilization, fragmentation, or other destructive processes that create a broad collection of materials including one or more gases. This is distinguishable from, for example, image transfer. Imaging or relief image formation is achieved using "laser engraving" that can also be known as "ablation imaging" or "ablative engraving". Non-imaged regions of the laser-engraveable layer are not removed or volatilized to an appreciable extent and thus form the upper surface of the relief image.

The "relief-forming, laser-engraveable layer" refers to the outermost surface of the flexographic printing precursor in which a relief image is formed and is the first surface of the precursor that is struck by imaging radiation. This layer is also referred to herein as the "laser-engraveable layer".

The term "relief image" refers to all of the topographical features of the flexographic printing member provided by imaging and designed to transfer a pattern of ink to a receiver element. The term "relief image floor" refers to the bottommost surface of the relief image. For example, the floor can be considered the maximum dry depth of the relief image from the topmost surface and can be at least 50 μm and up to and including 1000 μm and typically at least 100 μm and up to and including 800 μm. The relief image generally includes "valleys" that are not inked and that have a depth from the topmost surface that is less than the maximum floor depth.

Unless otherwise indicated, the term "weight %" refers to the amount of a component or material based on the total dry weight of the composition or layer in which it is located.

The term "binder" refers to the sum of all organic polymeric components, such as thermoplastic, thermoplastic elastomeric polymeric, or rubber components that are not in the form of discrete organic particles, within the laser-engravable layer.

The term "active porous particles" refers to crosslinked organic porous particles described herein that contain one or more radiation absorbers (such as an infrared radiation absorber) therein, either within the crosslinked organic solid phase, in at least some of the pores, or in both the crosslinked organic solid phase and in at least some of the pores, wherein the radiation absorber can absorb the radiation generated from the laser that causes ablation of the laser-engraveable layer. Useful radiation absorbers are described below.

An "inactive particle" is therefore defined as a particle that does not absorb laser radiation.

Laser-Engraveable Layer

In general, the laser-engraveable layer has a dry thickness of at least 50 μm and generally at least 50 μm and up to and including 4,000 μm, or at least 200 μm and up to and including 2,000 μm.

The relief image obtained using the present invention is formed in the laser-engraveable layer that comprises as its primary or predominant component, one or more thermoplastic elastomeric resins, crosslinked elastomers, or rubbery resins such as vulcanized rubbers. The laser-engraveable layer can be chemically crosslinked, physically crosslinked, or non-crosslinked. For example, the laser-engraveable layer can include one or more thermosetting or thermoplastic urethane resins that are derived from the reaction of a polyol (such as polymeric diol or triol) with a polyisocyanate, or the reaction of a polyamine with a polyisocyanate. In other embodiments, the laser-engraveable layer comprises a chemically-crosslinked elastomeric resin and a thermally initiated reaction product of a multifunctional monomer or oligomer.

Other useful elastomeric resins include copolymers or styrene and butadiene, copolymers of isoprene and styrene, styrene-butadiene-styrene block copolymers, styrene-isoprene-styrene copolymers, other polybutadiene or polyisoprene elastomers, nitrile elastomers, polychloroprene, polyisobutylene and other butyl elastomers, any elastomers containing chlorosulfonated polyethylene, polysulfide, polyalkylene oxides, or polyphosphazenes, elastomeric polymers of (meth)acrylates, elastomeric polyesters, and other similar polymers known in the art. Other useful polymers include polyisocyanate, polybutadiene or polyisoprene elastomers, nitrile polymers, and other similar polymers known in the art. Other useful elastomeric resins include copolymers of any of the polymers described above.

Still other useful laser-engraveable resins include vulcanized rubbers, such as EPDM (ethylene-propylene diene rubber), Nitrile (Buna-N), Natural rubber, Neoprene or chloroprene rubber, silicone rubber, fluorocarbon rubber, fluorosilicone rubber, SBR (styrene-butadiene rubber), NBR (acrylonitrile-butadiene rubber), ethylene-propylene rubber, and butyl rubber.

Particularly useful laser-engraveable resins include any of the resins described herein that are available as, or can be prepared as aqueous lattices, dispersions, emulsions, or suspensions. Examples of these materials include but are not limited to, acrylic polymer emulsions and aqueous polyurethane resins that are available from Picassian Polymers, aqueous polypropylene carbonate) dispersion that is available from Empower Materials (Germany), styrene butadiene rubber (SBR) emulsions that are available from Dow Chemical and BASF, polyurethane dispersions that are available from Witco Corporation. Other useful materials include styrene-acrylic copolymer emulsions, polydimethylsiloxane (PDMS) and PDMS copolymer emulsions, SBR, SEBR, and EPDM emulsions or dispersions, dispersion of polyethylene, polypropylene, and copolymers of these with (meth)acrylic acid.

Still other useful laser-engraveable resins are polymeric materials that, upon heating to 300° C. (generally under nitrogen) at a rate of 10° C./minute, lose at least 60% (typically at least 90%) of their mass and form identifiable low molecular weight products that usually have a molecular weight of 200 or less. Specific examples of such laser engraveable materials include but are not limited to, poly(cyanoacrylate)s that include recurring units derived from at least one alkyl-2-cyanoacrylate monomer and that forms such monomer as the predominant low molecular weight product during ablation. These polymers can be homopolymers of a single cyanoacrylate monomer or copolymers derived from one or more different cyanoacrylate monomers, and optionally other ethylenically unsaturated polymerizable monomers such as (meth)acrylate, (meth)acrylamides, vinyl ethers, butadienes, (meth)acrylic acid, vinyl pyridine, vinyl phosphonic acid, vinyl sulfonic acid, and styrene and styrene derivatives (such as α-methylstyrene), as long as the non-cyanoacrylate comonomers do not inhibit the ablation process. The monomers used to provide these polymers can be alkyl cyanoacrylates, alkoxy cyanoacrylates, and alkoxyalkyl cyanoacrylates. Representative examples of poly(cyanoacrylates) include but are not limited to poly(alkyl cyanoacrylates) and poly(alkoxyalkyl cyanoacrylates) such as poly(methyl-2-cyanoacrylate), poly (ethyl-2-cyanoacrylate), poly(methoxyethyl-2-cyanoacrylate), poly(ethoxyethyl-2-cyanoacrylate), poly(methyl-2-cyanoacrylate-co-ethyl-2-cyanoacrylate), and other polymers described in U.S. Pat. No. 5,998,088 (Robello et al.).

In still other embodiments, the laser-engraveable layer can include an alkyl-substituted polycarbonate or polycarbonate block copolymer that forms a cyclic alkylene carbonate as the predominant low molecular weight product during depolymerization from engraving. The polycarbonate can be amorphous or crystalline, and can be obtained from a number of commercial sources including Aldrich Chemical Company (Milwaukee, Wis.). Representative polycarbonates are described for example in U.S. Pat. No. 5,156,938 (Foley et al.), Cols. 9-12 of which are incorporated herein by reference. Representative polycarbonates include poly(propylene carbonate) and poly(ethylene carbonate). These polymers can be obtained from various commercial sources or prepared using known synthetic methods.

In still other embodiments, the laser-engraveable polymeric binder is a polycarbonate (tBOC type) that forms a diol and diene as the predominant low molecular weight products from depolymerization during laser-engraving.

It is also useful for the laser-engraveable layer to include a mixture of ethylene-propylene-diene terpolymer (EPDM) rubbers including at least one high molecular weight EPDM resin and at least one low molecular weight EPDM resin. The high EPDM rubbers generally have a molecular weight of at least 200,000 and up to and including 800,000 and more typically at least 250,000 and up to and including 500,000. The high molecular weight rubbers are generally solid form and the molecular weight is at least 30 times (or even 50 times) higher than that of the low molecular weight EPDM rubbers. The high molecular weight EPDM rubbers can be obtained as Keltan® EPDM (from DSM Elastomers) and Royalene® EPDM (from Lion Copolymers).

The one or more low molecular weight EPDM rubbers are usually in liquid form, and having a molecular weight of at least 2,000 and up to and including 10,000 and typically at least 2,000 and up to and including 8,000. A useful low molecular weight EPDM rubber is available as Trilene® EPDM (from Lion Copolymers).

These two components can be present at a weight ratio (high molecular weight EPDM rubber to low molecular weight EPDM) of at least 2:1 and up to and including 10:1 or at least 3:1 and up to and including 5:1.

Further, the laser-engraveable layer can include one or more nanocrystalline polyolefins as an elastomeric resin or thermoplastic elastomeric resin, as described in copending and commonly assigned U.S. Ser. No. 13/053,700 (noted above) and incorporated herein by reference. Useful nanocrystalline polyolefins include but are not limited to homopolymers of ethylenically unsaturated olefin hydrocarbons having 2 to 20 carbon atoms and typically from 2 to 8 carbon atoms. Such unsaturated α-olefins having at least 3 carbon atoms can have various linear or branched alkyl side chains, and any of the olefins can have other side chains provided that the side chains do not adversely affect the polyolefin morphology or thermoplastic and elastomeric properties. Nanocrystalline polymers also include copolymers that comprise at least two different randomly ordered olefin recurring units. For example, these copolymers can include randomly recurring units derived (polymerized) from two or more different olefins having at least 2 and up to 20 carbon atoms, for example, a combination of recurring ethylene, propylene, butylenes, octene, and norbornene recurring units, in a random order in the polymer backbone. In such copolymers, one type of olefin recurring unit can predominate. Other useful commercial examples of nanocrystalline polyolefins are found as the Notio™ products from Mitsui Chemicals America, Inc., Rye Brook, N.Y., and as the Engage™ products from Dow Chemical Ayer, Mass. Other useful thermoplastic polyolefins include olefinic block copolymers, such as those sold under the name Dynalloy™ products by PolyOne GLS Thermoplastic Elastomers of PolyOne Corporation, and Infuse™ products available from Dow Chemical.

Still other useful nanocrystalline polyolefins can be prepared using known synthetic procedures as described, but not limited to, for example in U.S. Pat. Nos. 6,930,152 (Hashimoto et al.) and 7,253,234 (Mori et al.), and U.S. Patent Application Publication 2008-0220193 (Tohi).

The laser-engraveable layer comprises the thermoplastic elastomeric resins, crosslinked elastomers, or rubbery resins such as vulcanized rubbers, in an amount of at least 30 weight % and up to and including 95 weight %, or typically at least 50 weight % and up to and including 90 weight %, based on the total dry layer weight.

Other useful laser-engraveable compositions are described in copending and commonly assigned U.S. Ser. No. 13/173, 430 (filed Jun. 30, 2011 by Melamed, Gal, and Dohan). These compositions comprise one or more CLCB EPDM elastomeric resins as well as one or more radiation absorbers and optionally one or more peroxides.

Since most polymeric materials do not absorb radiation directly at a wavelength of at least 750 nm and up to and including 1400 nm, flexographic printing precursors prepared to be engraved using laser irradiation at these wavelengths can also comprise at least one infrared (IR) radiation absorber. Such IR absorbers can be in the form of metal particles, a dye or a particle that absorbs the laser energy and converts exposing photons into thermal energy. Such IR dyes typically have a specific absorption peak that will overlap with the laser radiation wavelength. Pigments such as a conductive or non-conductive carbon black have absorption properties that are panchromatic over the entire near infrared spectrum.

For example, the laser-engraveable layer can comprise a radiation absorber in an amount of at least 0.5 weight % and up to and including 35 weight %, and particularly at least 3 weight % and up to and including 15 weight %, based on total dry layer weight.

The radiation absorbers useful for this invention can be located or dispersed within the binder(s) of the laser-engravable layer, or within the chemically-crosslinked organic porous particles.

Particularly useful infrared radiation absorbers are responsive to exposure from IR lasers. Mixtures of the same or different types of infrared radiation absorbers, described below, can be used if desired. A wide range of infrared radiation absorbers are useful in the present invention, including carbon blacks and other IR-absorbing organic or inorganic pigments (including squarylium, cyanine, merocyanine, indolizine, pyrylium, metal phthalocyanines, and metal dithiolene pigments), and iron oxide and other metal oxides. Additional useful IR radiation absorbers include conductive carbon blacks and carbon blacks that are surface-functionalized with solubilizing or compatibilizing groups that are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Also useful are carbon blacks that are modified to have hydrophobic particle surfaces. Examples of useful carbon blacks include Mogul® L, Mogul® E, Emperor® 2000, Vulcan® XC-72, Sterling® C, Black Pearls® 280, 700 and 1300, Monarch® 800 and 1400, and Regal®330, and 400, all from Cabot Corporation (Boston Mass.). Other useful pigments include, but are not limited to, Heliogen Green, Nigrosine Base, iron (III) oxides, transparent iron oxides, magnetic pigments, manganese oxide, Prussian Blue, and Paris Blue. Other useful IR radiation absorbers are carbon nanotubes such as single- and multi-walled carbon nanotubes, graphite, graphene, and porous graphite. Graphene is an atomically thick, two-dimensional sheet composed of carbon atoms arranged in a honeycomb structure. It can be viewed as the building block of all other graphitic carbon allotropes of different dimensionality for example, graphite is made of graphene sheets stacked on top of each other. Examples of useful graphenes include, but are not limited to, xGnP graphene nanoplatelets from XG Sciences, MI, including Grade M particles that have an average thickness of approximately 6-8 nm and a typical surface area of 120 $m^2/g$ to 150 $m^2/g$, and Vor-X functionalized graphene nanosheets from Vorbec Materials, MD, and graphene from Graphene Industries (UK) and Graphene Laboratories (MA). Useful radiation absorbers include all types of carbon black as described above. Various carbon blacks (conductive or non-conductive) are particularly useful as infrared radiation absorbers in the practice of this invention.

Other useful infrared radiation absorbers (such as organic dyes having a $\lambda_{max}$ of at least 800 nm) are described in U.S. Pat. Nos. 4,912,083 (Chapman et al.), 4,942,141 (DeBoer et al.), 4,948,776 (Evans et al.), 4,948,777 (Evans et al.), 4,948,778 (DeBoer), 4,950,639 (DeBoer et al.), 4,950,640 (Evans et al.), 4,952,552 (Chapman et al.), 4,973,572 (DeBoer), 5,036,040 (Chapman et al.), and 5,166,024 (Bugner et al.), all of which are incorporated herein by reference.

Dyes and pigments absorbing UV or visible radiation can also be used with lasers emitting at shorter wavelengths. Useful classes of dyes include but are not limited to, cyanine, merocyanine, methine, azamethine, triarylmethane, coumarin, rhodamine, azo and metal complex azo, stilbene, formazan and metal complex formazan, metal phthalocyanine, indigo, anthraquinone and anthrapyridone dyes. Any of the pigments described in "Industrial Organic Pigments, Third Edition" by Herbst and Hunger published by Wiley-VCH (2004) can be considered. Useful classes of pigments include but are not limited to, azo, quinophthalone, quinacridone, perylene, dioxazine, diketopyrollo-pyrrole, anthraquinone, indigo and thioindigo, phthalocyanine and metal phthalocyanine pigments.

When pigments or particulate absorbers are used, it should be recognized that a finer dispersion of very small particles will provide an optimum ablation feature resolution and ablation sensitivity. Particularly suitable are those with diameters less than 1 μm. Dispersants and surface functional ligands can be used to improve the quality of the carbon black or metal oxide, or pigment dispersion so that uniform incorporation of the IR radiation absorber throughout the laser-ablatable, relief-forming layer can be achieved. Thus, the IR radiation absorbers can be provided within the crosslinked organic solid phase of the chemically-crosslinked organic porous particles, within some or all of the pores of the chemically-crosslinked organic porous particles, or both in the chemically crosslinked organic solid phase and in some or all of the pores of the chemically-crosslinked organic porous particles.

The chemically-crosslinked organic porous particles used in the practice of this invention are generally prepared, as described below, using multiple water-in-oil emulsions in combination with an aqueous suspension process. One or more water-in-oil emulsions can be originally prepared and used to provide two or more discrete pores in the chemically-crosslinked organic porous particles.

The terms "chemically-crosslinked organic porous particle" and "chemically-crosslinked organic porous particles" are used herein, unless otherwise indicated, to refer to materials useful in the present invention. The chemically-crosslinked organic porous particles comprise a chemically-crosslinked organic solid phase, optionally having an external particle surface, and discrete pores (for example, first and second different discrete types of pores) dispersed within the chemically crosslinked organic solid phase. Unless otherwise indicated, the terms "chemically crosslinked organic porous particles" and "crosslinked organic porous particles" are intended to mean the same thing.

In many embodiments, the chemically-crosslinked organic solid phase of the chemically-crosslinked organic porous particles has the same composition. That is, the chemically-crosslinked organic solid phase is uniform in composition including any additives that can be incorporated into the crosslinked polymer binder. In addition, if mixtures of organic polymers are present in the chemically-crosslinked organic solid phase, those organic polymeric mixtures are dispersed uniformly throughout the chemically-crosslinked organic porous particles. For example, the chemically-crosslinked organic porous particles comprise a chemically-crosslinked elastomeric resin that has a glass transition temperature of less than or equal to 20° C.

The term "porogen" refers to a pore forming agent used to make the chemically-crosslinked organic porous particles. A porogen can be the aqueous phase of the water-in-oil emulsions (that is the first and second aqueous phases), the pore stabilizing hydrocolloid, and any other additive in the aqueous phase that can modulate the porosity of the chemically-crosslinked organic porous particles.

The terms "first discrete pore" and "second discrete pore" refer to different isolated pores in the chemically-crosslinked organic porous particle. First and second discrete pores can refer to distinct individual pores, or in most embodiments, they refer to distinct sets of pores. Each set of pores includes a plurality of pores, which pores are isolated from each other, and the pores of each set of pores are isolated from all other pores of the other sets of pores in the chemically-crosslinked organic porous particle. The word "discrete" is also used to define different droplets of the first and second aqueous phases when they are suspended in the oil phase (described below).

The size of the chemically-crosslinked organic porous particle, the formulation, and manufacturing conditions are the primary controlling factors for pore size. However, generally the discrete pores have an average size of at least 100 nm (0.1 μm) and up to and including 4000 nm (4 μm), or more likely at least 100 nm (0.1 μm) and up to and including 2000 nm (2 μm). The discrete pores in the chemically-crosslinked organic porous particles (for example, the first and second discrete pores) can have the same or different average sizes. Pore size can be determined by analyzing Scanning Electron Microscopy (SEM) images of fractured chemically-crosslinked organic porous particles using a commercial statistical analysis software package to study the distribution of the pores within the chemically-crosslinked organic porous particles, or by manually measuring the pore diameters using the scale in the SEM images. For example, the "average" pore size can be determined by calculating the average diameter of 20 measured pores.

The chemically-crosslinked organic porous particles generally have a mode particle size of at least 2 µm and less than 100 µm, or typically at least 5 µm and up to an including 70 µm, with this mode particle size being measured for example, by automated image analysis and flow cytometry using any suitable equipment designed for this purpose. The mode particle size represents the most frequently occurring diameter for spherical chemically-crosslinked organic porous particles and the most frequently occurring largest diameter for the non-spherical chemically-crosslinked organic porous particles in a particle size distribution histogram.

The chemically-crosslinked organic porous particles used in this invention can also have small colloidal inorganic particles on the external particle surfaces. These colloidal inorganic particles can be interspersed on the external particle surfaces or they can be arranged in a pattern or entirely cover the external particle surfaces in a layer. Such colloidal inorganic particles can be composed of for example, colloidal silica, colloidal alumina, colloidal titania, clay particles, or mixtures thereof. These colloidal inorganic particles can be individual particles, or aggregates of particles, ranging in particle or aggregate size of at least 5 nm and up to and including 2 µm.

In general, the chemically-crosslinked organic porous particles have porosity of at least 1% and up to and including 80%, or more likely at least 1% and up to and including 50%, or typically at least 10% and up to an including 30% to improve visualization of the chemically-crosslinked organic porous particles, all based on the total chemically-crosslinked organic porous particle volume. Porosity can be measured by the mercury intrusion technique or a time-in-flight method.

The discrete pores (such as first and second discrete pores) can also comprise pore stabilizing hydrocolloids that are described below. If both the first and second discrete pores are present, they can have the same or different stabilizing hydrocolloids. In most instances, the same pore stabilizing hydrocolloid is used throughout the chemically-crosslinked organic porous particles.

The chemically-crosslinked organic porous particles can be spherical or non-spherical depending upon the desired use.

As described above, the chemically-crosslinked organic porous particles can include a radiation absorber as a marker material. Such radiation absorber can be used to improve laser-engraveability. The radiation absorbers can be in first or second discrete pores, or in both sets of pores. Alternatively, they can be distributed within the chemically-crosslinked organic solid phase alone, or in both the chemically-crosslinked organic solid phase or in at least some of the pores. Useful infrared radiation absorbers include all types of carbon black and other pigments and dyes described above.

The radiation absorbers can be present, independently, in an amount of at least 0.001 weight % and up to and including 35 weight %, or at least 5 weight % and up to and including 25 weight %, all based on the total dry weight of the chemically-crosslinked organic porous particles in the laser-engraveable layer.

In the embodiments of this invention comprising mixtures of different chemically-crosslinked organic porous particles (for example, a mixture of first and second chemically-crosslinked organic porous particles) in which the chemically-crosslinked organic solid phases have different polymer compositions or the same polymer compositions and different pore sizes or different radiation absorbers.

The chemically-crosslinked organic porous particles can be provided as powders or as aqueous suspensions (as in water or in mixtures of water and water-miscible organic solvents such as alcohols). Such aqueous suspensions can also include surfactants or suspending agents to keep the chemically-crosslinked organic porous particles suspended. In addition, the chemically-crosslinked organic porous particles can be provided in organic solvent suspensions using for example, one or more of methanol, ethanol, isopropanol, acetone, ethyl acetate, propyl acetate, cyclohexane, dodecane, and toluene as representative organic solvents, or in varnishes or lacquers.

Compositional features of the chemically-crosslinked organic porous particles are described in the following description of methods for preparing them. The polyfunctional reactive compounds, the reagents that cause crosslinking, the ethylenically unsaturated polymerizable monomers, the organic solvents, and pore stabilizing hydrocolloids used to form the chemically-crosslinked organic solid phase are described below.

Methods of Preparing Chemically-Crosslinked Organic Porous Particles

A method for making the chemically-crosslinked organic porous particles involves the formation of one or more (for example, first and second) water-in-oil emulsions. A first stable water-in-oil emulsion is formed, including a first aqueous phase that is dispersed in a first oil phase. This first oil phase comprises a first polyfunctional reactive compound, a first reagent that causes crosslinking, optionally at least one first ethylenically unsaturated polymerizable monomer, and optionally a first organic solvent. The first aqueous phase creates the first discrete pores in the resulting chemically-crosslinked organic porous particles. The first aqueous phase can also include a first pore stabilizing hydrocolloid and a first radiation absorber material.

Useful polyfunctional reactive compounds, reagents that cause crosslinking, ethylenically unsaturated polymerizable monomers, and organic solvents are described below. They are used to form a chemically-crosslinked organic solid phase (polymer phase) in the chemically-crosslinked organic porous particles.

The method can optionally provide a second water-in-oil emulsion comprising a second aqueous phase comprising a second pore stabilizing hydrocolloid (and optionally, a second radiation absorber material) dispersed in a suitable second oil phase. This second oil phase comprises a second polyfunctional reactive compound, a second reagent that causes crosslinking, optionally at least one second ethylenically unsaturated polymerizable monomer, and optionally a second organic solvent. This second aqueous phase creates the second discrete pores in the resulting chemically-crosslinked organic porous particles. As described above, the second marker material is detectably different from the first radiation absorber material.

The first and second pore stabilizing hydrocolloids (described below) can be the same or different chemicals, or the same or different mixtures of chemicals. In most embodiments, they are the same chemicals. In addition, the first and second oil phases can comprise the same or different organic solvents (described below), or the same or different mixtures of organic solvents. In most embodiments, the first and second oil phases contain the same organic solvents. Further, the first and second polyfunctional reactive compounds or first and second ethylenically unsaturated monomers and first and second reagents that cause crosslinking used in preparing the first and second oil phases can be the same or different compounds, or mixtures of compounds, but in most embodiments, they are the same compounds in both oil phases.

Suitable pore stabilizing hydrocolloids for preparing all of the emulsions described herein include both naturally occurring and synthetic, water-soluble or water-swellable polymers selected from the group consisting of cellulose derivatives [such for example, carboxymethyl cellulose (CMC) that is also referred to as sodium carboxymethyl cellulose], gelatin (for example, alkali-treated gelatin such as cattle bone or hide gelatin, or acid treated gelatin such as pigskin gelatin), gelatin derivatives (for example, acetylated gelatin and phthalated gelatin), proteins and protein derivatives, hydrophilic synthetic polymers [such as poly(vinyl alcohol), poly(vinyl lactams), acrylamide polymers, polyvinyl acetals, polymers of alkyl and sulfoalkyl acrylates and methacrylates, hydrolyzed polyvinyl acetates, polyamides, poly(vinyl pyridine), and methacrylamide copolymers], water soluble microgels, polyelectrolytes [such as a polystyrene sulfonate, poly(2-acrylamido-2-methylpropanesulfonate), and a polyphosphate], and mixtures of any of these classes of materials.

In order to stabilize the initial water-in-oil emulsions so that they can be held without ripening or coalescence, it is desired that the pore stabilizing hydrocolloids in the aqueous phase have a higher osmotic pressure than that of the first and second oil phases depending on the solubility of water in the oil. This reduces the diffusion of water into the oil phases from the aqueous phases and thus the ripening caused by migration of water between the water droplets. One can achieve a higher osmotic pressure in the aqueous phase either by increasing the concentration of the pore stabilizing hydrocolloid or by increasing the charge on the pore stabilizing hydrocolloid (the counter-ions of the dissociated charges on the pore stabilizing hydrocolloid increase its osmotic pressure). It can be advantageous to have weak base or weak acid moieties in the pore stabilizing hydrocolloids that allow for their osmotic pressures to be controlled by changing the pH. Such pore stabilizing hydrocolloids are considered "weakly dissociating hydrocolloids". For these weakly dissociating hydrocolloids, the osmotic pressure can be increased by buffering the pH to favor dissociation, or by simply adding a base (or acid) to change the pH of the aqueous phase to favor dissociation. One example of such a weakly dissociating hydrocolloid is CMC that has a pH sensitive dissociation (the carboxylate is a weak acid moiety). For CMC, the osmotic pressure can be increased by buffering the pH, for example using a pH 6-8 buffer, or by simply adding a base to raise the pH of the aqueous phase to favor dissociation. For aqueous phases containing CMC the osmotic pressure increases rapidly as the pH is increased from 4-8.

Other synthetic polyelectrolyte hydrocolloids such as polystyrene sulfonate (PSS), poly(2-acrylamido-2-methylpropanesulfonate) (PAMS), and polyphosphates are also useful pore stabilizing hydrocolloids.

For example, the first and second pore stabilizing hydrocolloids are the same or different and independently selected from the group consisting of carboxymethyl cellulose (CMC), a gelatin, a protein or protein derivative, a hydrophilic synthetic polymer, a water-soluble microgel, a polystyrene sulfonate, poly(2-acrylamido-2-methylpropanesulfonate), and a polyphosphate.

The pore stabilizing hydrocolloids are soluble in water, have no negative impact on multiple emulsification processes, and have no negative impact on melt rheology of the resulting chemically-crosslinked organic porous particles. The amount of the first and second pore stabilizing hydrocolloids used to prepare the first and second emulsions (and any additional emulsions) will depend on the amount of porosity and size of pores desired and the molecular weight and charge of the pore stabilizing hydrocolloid that is chosen. For example, the first and second pore stabilizing hydrocolloids can be different in the first and second aqueous phases, resulting in chemically-crosslinked organic porous particles having first discrete pores that are different in size from the second discrete pores. CMC is particularly useful as a pore stabilizing hydrocolloid in both first and second water-in-oil emulsions in an amount of at least 0.5 weight % and up to and including 20 weight %, or at least 1 weight % and up to and including 10 weight %, based on the total weight of first and second aqueous phases used in each emulsion.

The first and second aqueous phases used in forming the first and second water-in-oil emulsions can additionally contain, if desired, salts to buffer the emulsions and optionally to control the osmotic pressure of the aqueous phases. When CMC is used, for example, the osmotic pressure can be increased by buffering using a pH 7 buffer. The first and second emulsions can also contain additional pore forming agents such as ammonium carbonate.

The first and second polyfunctional reactive compounds used in the first and second oil phases (or additional oil phases) are crosslinkable through chain growth or step growth polymerization reactions. The mechanistic pathways in each of these reactions are different. Chain-growth polymerization proceeds as a result of free-radicals or ions, whereas in step-growth polymerization, functional groups react with each other to increase the chain length or crosslink chains. This distinction was introduced by Paul Flory in 1953, as described in "Principles of Polymer Chemistry", Cornell University Press, 1953, p.39.

Polyfunctional reactive compounds suitable for chain growth polymerization include polyfunctional polymerizable monomers and oligomers such as acrylate and methacrylate oligomers [the term "(meth)acrylate" used herein refers to acrylate and methacrylate] of polyfunctional compounds, such as polyhydric alcohols and their derivatives having (meth)acrylate functional groups such as ethoxylated trimethylolpropane tri(meth)acrylate, tripropylene glycol di(meth)acrylate, trimethylolpropane tri(meth)acrylate, diethylene glycol di(meth)acrylate, pentaerythritol tetra (meth)acrylate, pentaerythritol tri(meth)acrylate, dipentaerythritol hexa(meth)acrylate, 1,6-hexanediol di(meth)acrylate, or neopentyl glycol di(meth)acrylate and mixtures thereof, and acrylate and methacrylate oligomers derived from low-molecular weight polyester resins, polyether resins, epoxy resins, polyurethane resins, alkyd resins, spiroacetal resins, epoxy acrylates, polybutadiene resins, and polythiolpolyene resins, and mixtures thereof that are capable of being dissolved in a suitable solvent or diluent monomers (described below) that are immiscible with the aqueous water phases and are substantially insoluble in water.

Additional polyfunctional reactive compounds suitable for chain growth polymerization also include polyfunctional monomers such as divinyl benzene, ethylene glycol dimethacrylate, trimethylolpropane triacrylate, hexanediol dimethacrylate, tripropylene glycol dimethacrylate, diethylene glycol dimethacrylate, pentaerythritol triacrylate, dipentaerythritol hexamethacrylate, and neopentyl glycol di(meth)acrylate, and mixtures thereof.

Useful polyfunctional reactive compounds suitable for chain growth polymerization include urethane acrylate and methacrylate oligomers that are derived from reacting diisocyanates with a oligo(poly)ester or oligo(poly)ether polyol to yield an isocyanate terminated urethane. Subsequently, hydroxy terminated acrylates are reacted with the terminal isocyanate groups. This acrylation provides unsaturation at the ends of the oligomer. The aliphatic or aromatic nature of the urethane acrylate is determined by the choice of diisocyanates. An aromatic diisocyanate, such as toluene diisocyanate, will yield an aromatic urethane acrylate oligomer. An aliphatic urethane acrylate will result from the selection of an aliphatic diisocyanate, such as isophorone diisocyanate or hexyl methyl diisocyanate. Beyond the choice of isocyanate, the polyol backbone plays a pivotal role in determining the performance of the final the oligomer. Polyols are generally classified as esters, ethers, or a combination of these two. The oligomer backbone is terminated by two or more acrylate or methacrylate units, which serve as reactive sites for chain growth polymerization. Choices among isocyanates, polyols, and acrylate or methacrylate termination units allow considerable latitude in the development of urethane acrylate oligomers. Urethane acrylates like most oligomers are typically high in molecular weight and viscosity. These multifunctional reactive compounds contain multiple reactive sites. Their functionality can vary from 2 to 6. Particularly useful polyfunctional reactive compounds for chain growth polymerization include polyfunctional esters such as polybutadiene dimethacrylate and 1,6-hexanediol diacrylate, and polyhydric alcohols and their derivatives such as mixtures of acrylate derivatives of pentaerythritol, including pentaerythritol tetraacrylate and pentaerythritol triacrylate functionalized aliphatic urethanes derived from isophorone diisocyanate. Examples of useful polyfunctional reactive urethane acrylate compounds, and mixed esters of polybutadiene dimethacrylate and 1,6-hexanediol diacrylate compounds that are commercially available oligomers from Sartomer Company (Exton, Pa.), such as CN 968 and CN301.

Polyfunctional reactive compounds suitable for step growth polymerizations include polymers such as those derived from vinyl monomers and condensation monomers such as esters and mixtures thereof. Such polymers include those that have an acid or hydroxyl number greater than 2, examples include but are not limited to polymers such as polyesters, polyurethanes, urethane acrylic copolymers, epoxy resins, silicone resins, polyamide resins, modified rosins, paraffins, and waxes. Still other useful polymers are polyesters of aromatic or aliphatic dicarboxylic acids with one or more aliphatic diols, such as polyesters of isophthalic or terephthalic or fumaric acid with diols such as ethylene glycol, cyclohexane dimethanol, and bisphenol adducts of ethylene or propylene oxides. Such polymers can also be derived from vinyl monomers such as styrenic polymers, monoolefin polymers (for example, polymers formed from one or more of ethylene, propylene, butylene, and isoprene), vinyl ester polymers (for example, polymer formed from one or more of vinyl acetate, vinyl propionate, vinyl benzoate, and vinyl butyrate), polymers formed from one or more $\alpha$-methylene aliphatic monocarboxylic acid esters (for example, polymers formed from one or more of methyl acrylate, ethyl acrylate, butyl acrylate, dodecyl acrylate, octyl acrylate, phenyl acrylate, methyl methacrylate, ethyl methacrylate, butyl methacrylate, and dodecyl methacrylate), vinyl ether polymers (such as polymers formed from one or more of vinyl methyl ether, vinyl ethyl ether, and vinyl butyl ether), and vinyl ketone polymers (for example, polymers formed from one or more of vinyl methyl ketone, vinyl hexyl ketone, and vinyl isopropenyl ketone), all of the above copolymerized with monomers such as (meth)acrylic acid, maleic acid, hydroxyethyl (meth)acrylate and the like to result in polyfunctional reactive compounds such that they are capable of being crosslinked with a reagent that causes crosslinking, being dissolved in a suitable solvent or ethylenically unsaturated monomers (described below) that are immiscible with the aqueous water phases and are substantially insoluble in water.

Ethylenically unsaturated polymerizable monomers useful in this invention include monofunctional monomers, such as acrylate and methacrylate monomers, and vinyl monomers, for example, methyl methacrylate, butyl (meth)acrylate, 2-ethylhexyl (meth)acrylate, styrene, vinyl pyrrolidone, and mixtures thereof. It is not outside the scope of this invention to use monoethylenically unsaturated oligomers in place of or in addition to the ethylenically unsaturated monomers described above.

Polyfunctional reactive compounds, crosslinkable through chain growth polymerization or step growth polymerization can be used in any or all of the oil phases are described above.

When an oil phase contains one or more of the polyfunctional reactive compounds that are crosslinkable through chain growth polymerization reactions including ethylenically unsaturated polymerizable monomers described above, that oil phase also includes a suitable reagent that causes crosslinking that is typically a free radical initiator that provides free radicals useful for initiating and continuing free radical chain growth polymerization. Useful free radical initiators for chain growth polymerization reactions well known in the art and include such classes of compounds as azo compounds, peroxides, and other oil-soluble free radical initiators that are readily available from a number of commercial sources. A skilled worker would understand how much of a specific initiator would be best for specific monomers. Typically, an initiator is present in an amount of at least 1 weight % and up to and including 5 weight % based on the total weight of the polyfunctional reactive compound and the ethylenically unsaturated monomers that can be polymerized by chain growth polymerization. The free radical initiator can be activated by heat or light such as UV radiation. The temperature or wave length of light used depends on the half life of the initiator at the desired temperature or the absorption characteristics of the photoinitiator respectively.

When an oil phase contains one or more of the polyfunctional reactive compounds crosslinkable through step growth polymerization reactions monomers described above, that oil phase also includes a suitable reagent that causes crosslinking that is typically a reactive compound that provides appropriate functional groups for step growth polymerization. Useful step growth polymerization reactions are polyfunctional aziridines or polyfunctional glycidyl compounds. Examples of useful reagents that cause crosslinking through step growth polymerization include but are not limited to, CX-100, a polyfunctional aziridine from DSM Neo Resins, and ERISYS GE240, a tetra glycidyl m-xylene diamine from CVC Thermoset Specialties, butanediol diglycidyl ether, 2,3-dihydroxydioxane, chromium potassium sulfate, and zinc ammonium carbonate.

Any suitable organic solvent that will dissolve the polyfunctional reactive compound and the ethylenically unsaturated polymerizable monomers and that is also immiscible with water can be used to prepare the first and second emulsions (or additional emulsions). Such organic solvents include but are not limited to, methyl acetate, ethyl acetate, propyl acetate, chloromethane, dichloromethane, vinyl chloride, trichloromethane, carbon tetrachloride, ethylene chloride, trichloroethane, toluene, xylene, cyclohexanone, 2-nitropropane, dimethyl carbonate, and mixtures of two or more of these solvents. Ethyl acetate and propyl acetate are generally good solvents for many useful polymers while being sparingly soluble in water, and they are readily removed as described below by evaporation. In the case where the polyfunctional reactive compound is crosslinked using chain growth polymerization, the organic solvent if used, is removed prior to completion of the crosslinking reaction. It can be removed after the water-in-oil-in-water emulsion is formed and before the free radical initiator is activated by light or heat, or it can be removed after the chain growth polymerization is allowed to proceed partially or fully. The function of the solvent in all cases is not only to dissolve the multifunctional reactive compounds but also to provide a template for increasing porosity by accommodating increased weight fraction of the aqueous phases in the first and second emulsions.

Optionally, organic solvents that will dissolve the polymers and that are immiscible with water can be a mixture of two or more water-immiscible solvents chosen from the list given above.

The first and second oil can also contain emulsifiers to stabilize the first and second water-in-oil emulsions. Such emulsifiers usually have a low HLB number. Useful emulsifiers for the water-in-oil emulsions include but are not limited to, sorbitan esters of fatty acids such as oleic acid and stearic acid, polyethylene oxide esters of fatty acids, Tetronic® 150R1 a tetrafunctional block copolymer with terminal secondary hydroxyl groups (available from BASF Corporation), and polyglycerol polyricinoleate, GRINDSTED® PGPR 90 (available from DANISCO®).

The first and second emulsions (and any additional emulsions) used to prepare the chemically-crosslinked organic porous particles can be prepared by any known emulsifying technique and conditions using any type of mixing and shearing equipment. Such equipment includes but is not limited to, a batch mixer, planetary mixer, single or multiple screw extruder, dynamic or static mixer, colloid mill, high pressure homogenizer, sonicator, or a combination thereof. While any high shear type agitation device is useful, a particularly useful homogenizing device is the Microfluidizer® such as Model No. 110T produced by Microfluidics Manufacturing operating at >5000 psi (>351.5 kg/cm$^2$). In this device, the droplets of the first and second aqueous phases can be dispersed separately and reduced in size in the respective oil (organic) phases in a high flow agitation zone and, upon exiting this zone, the particle size of the dispersed aqueous phases is reduced to uniform sized dispersed droplets in each of the oil phases. The temperature of the process can be modified to achieve the optimum viscosity for emulsification of the droplets and to minimize evaporation of the oil phases.

Optionally, the first and second water-in-oil emulsions can be combined to form a third water-in-oil emulsion containing a mixture of the first and second oil phases and distinct droplets of the first and second aqueous phases. The first and second water-in-oil emulsions can be combined in any desirable weight ratio. For example, in some embodiments, the weight ratio of the first water-in-oil emulsion to the second oil-in-water emulsion can be at least 1000:1 and to and including 0.01:1.

In some embodiments, a third oil phase (containing any of the organic solvents from the list of organic solvents described above) containing a third polyfunctional reactive compound (chosen from the list of polyfunctional reactive compounds described above) or ethylenically unsaturated polymerizable monomers and a reagent that causes crosslinking initiators (as described above) can be combined with the first and second water-in-oil emulsions. The third polyfunctional reactive compound can be the same or different from the first and second polyfunctional reactive compounds described above. The third oil phase containing the third polyfunctional reactive compound can be combined in this manner in any suitable amount in relation to the first and second water-in-oil emulsions, for example, but not limited to, a weight ratio of at least 100:1 and to and including 1:100. The addition of the third oil phase allows the manufacturer to use stock solutions of the first and second water-in-oil emulsions and to modify them as desired without having to make up fresh water-in-oil emulsions.

Either the first water-in-oil or the third water-in-oil emulsion is then dispersed in a third aqueous phase that can contain a surface stabilizing agent to form a water-in-oil-in-water emulsion containing droplets of either the first water-in-oil emulsion or the third water-in-oil emulsion, respectively. These third water-in-oil emulsion droplets contain the distinct droplets of the first and second aqueous phases. The third water-in-oil emulsion can be dispersed within a third aqueous phase in the presence of a colloidal silica stabilizing agent to form a water-in-oil-in-water emulsion, containing an aqueous suspension of oil droplets of the third water-in-oil emulsion, wherein the oil droplets contain discrete smaller droplets of the first aqueous phase, and second aqueous phase if present.

The water-in-oil-in-water emulsion is subjected to shear or extensional mixing or similar flow processes, for example through a capillary orifice device to reduce the droplet size and achieve narrow size distribution droplets through the limited coalescence process. The pH of the third aqueous phase is generally between 4 and 7 when colloidal silica is used as the stabilizing agent.

It can also be useful to add a shape control agent (described below) to one or more of the aqueous phases.

The suspension of droplets of the first water-in-oil (and second water-in-oil emulsion if present) in the third aqueous phase, results in droplets of the noted reactants dissolved in the oil containing the first aqueous phase (and second aqueous phase, if present) as distinct finer droplets within the bigger polymer droplets that upon drying produce discrete porous domains in the resulting chemically-crosslinked organic porous particles containing the polymer(s) as a chemically crosslinked organic solid phase.

Useful surface stabilizing agents include both water soluble polymers and small colloidal particles but are not limited to, stabilizer polymers such as poly(vinyl pyrrolidone) and poly(vinyl alcohol), inorganic stabilizers such as clay particles, colloidal silica (for example LUDOX™ or NALCO™), or polymer latex particles as described in modified ELC process described in U.S. Pat. Nos. 4,833,060 (Nair et al.), 4,965,131 (Nair et al.), 2,934,530 (Ballast et al.), 3,615,972 (Morehouse et al.), 2,932,629 (Wiley), and 4,314,932 (Wakimoto et al.), the disclosures of which are hereby incorporated by reference. Any combinations of these surface stabilizing agents can also be used.

The actual amount of surface stabilizing agent used in the method depends on the size of the final chemically-crosslinked organic porous particles desired, which in turn depends upon the volume and weight ratios of the various phases used for making the multiple emulsions. While not intending to be limiting, the amount of surface stabilizing agent can be at least 0.1 weight % and up to and including 10 weight %, or typically at least 0.2 weight % and up to and including 5 weight %, based on the total weight of the water-in-oil-in-water emulsion and depending upon the particle size of the surface stabilizing agent (for example, colloidal or fumed silica particles).

Where the water-in-oil-in-water emulsion is formed, shear or extensional mixing or flow process is controlled in order to minimize disruption of the distinct droplets of the first aqueous phase (and second aqueous phase, if present) in the oil phase(s). Droplet size reduction is achieved by homogenizing the final water-in-oil-in-water emulsion through a capillary orifice device, or other suitable flow geometry. The shear field used to create the droplets in the final water-in-oil-in-water emulsion can be created using standard shear geometries, such as an orifice plate or capillary. However, the flow field can also be generated using alternative geometries, such as packed beds of beads, or stacks or screens that impart an additional extensional component to the flow. It is well known in the literature that membrane-based emulsifiers can be used to generate multiple emulsions. The techniques allow the droplet size to be tailored across a wider range of sizes by adjusting the void volume or mesh size, and can be applied across a wide range of flow rates. The back pressure suitable for producing acceptable particle size and size distribution is at least 100 and up to and including 5000 psi (7 kg/cm² to 351.5 kg/cm²), or typically at least 500 and up to and including 3000 psi (35.1 kg/cm² to 211 kg/cm²). The flow rate is generally at least 1000 and up to and including 6000 ml per minute, particularly when a capillary orifice device is used.

The final size of the chemically-crosslinked organic porous particles and the final size of the pores in the chemically-crosslinked organic porous particles can be impacted by the osmotic mismatch between the osmotic pressure of the one or both of the first and second aqueous phases and the third aqueous phase. At each interface, the larger the osmotic pressure gradient present, the faster the diffusion rate where water will diffuse from the lower osmotic pressure phase to the higher osmotic pressure phase depending on the solubility and diffusion coefficient in the oil (organic) phase. If the osmotic pressure of the third aqueous phase is higher than the either or both of the first and second aqueous phases, then the water will migrate out of the pores and reduce the porosity and pore size. In order to maximize porosity, one can tailor the osmotic pressures so that the osmotic pressure of the third aqueous phase is lower, than the osmotic pressure of the first phase or both first and second aqueous phases. Thus, water will diffuse following the osmotic gradient from the third aqueous phase into the first aqueous phase (and second aqueous phase, if present) swelling the size of the distinct droplets of the first and second aqueous phases thereby increasing the final porosity and pore size. This osmotic shock is desirably created after the homogenization of the water-in-oil-in-water emulsion to minimize disruption of the distinct droplets of the aqueous phases.

If it is desirable to have small pores and maintain the initial small drop size formed in the making of the first and second emulsions, the osmotic pressure of both the interior and exterior aqueous phase can be matched, or have only a small osmotic pressure gradient. Depending on the osmotic pressure of each of the first and second aqueous phases and their values relative to the third aqueous phase, the resulting discrete pores can have different average sizes.

Optionally, additional water can be added to the water-in-oil-in-water emulsion to increase the size of the pores by creating an osmotic pressure mismatch between the first and second aqueous phases as described above.

Once the water-in-oil-in-water emulsion has been formed, the polyfunctional reactive compounds and optionally ethylenically unsaturated polymerizable monomer(s) supplied from one or both of the first and second water-in-oil emulsions, are polymerized to form precursor chemically-crosslinked organic porous particles having a chemically-crosslinked solid phase including an external particle surface, and discrete pores, and optionally first and second discrete pores that are isolated from each other and dispersed within the organic solid phase. This crosslinking can be instigated by the application of heat or radiation (for example actinic, IR, or UV radiation) as described earlier for initiating crosslinking by chain growth polymerization so that the polymerization initiator provides free radicals for monomer polymerization, crosslinking, and solidification. In the case of step growth polymerization, generally crosslinking is instigated with heat usually during solvent removal for solidification.

The first and second organic solvents, if present, can then be removed to produce an aqueous suspension of precursor chemically-crosslinked organic porous particles containing discrete pores such as first and second pores, which can contain suitable radiation absorbers. The precursor chemically-crosslinked organic porous particles can then be subjected to suitable isolation and drying techniques to provide the desired chemically-crosslinked organic porous particles. The details of this process depend upon the water solubility and boiling points of the organic solvents in the oil phases relative to the temperature of the drying process. Generally, however, organic solvents can be removed by evaporation using removal apparatus such as a rotary evaporator or a flash evaporator. The chemically-crosslinked organic porous particles can be isolated after removing the organic solvents by filtration or centrifugation, followed by drying for example in an oven at 40° C. that also removes any water remaining in the pores. Optionally, the chemically-crosslinked organic porous particles can be treated with alkali to remove any silica surface stabilizer particles.

The shape of the crosslinked porous particles can be modified to be spherical or non-spherical. In the method used to prepare the chemically-crosslinked organic porous particles, additives (shape control agents) can be incorporated into the first or second aqueous phases, in the first or second oil (organic) phase or in the third aqueous phase to modify the shape, aspect ratio or morphology of the chemically-crosslinked organic porous particles. The shape control agents can be added after or prior to forming the water-in-oil-in-water emulsion. In either case, the interfacial tension at the oil and third water interface is modified before solvent is removed, resulting in a reduction in sphericity of the chemically-crosslinked organic porous particles. Some useful shape control agents are quaternary ammonium tetraphenylborate salts described in U.S. Patent Application Publication 2007/0298346 (Ezenyilimba et al.), metal salts described in U.S. Patent Application Publication 2008/0145780 (Yang et al.), carnauba waxes described in U.S. Pat. No. 5,283,151 (Santilli), Solsperse® hyperdispersants as described in U.S. Pat. No. 5,968,702 (Ezenyilimba et al.), metal salts as described in U.S. Pat. No. 7,655,375 (Yang et al.), and zinc organic complexes as described in U.S. Pat. No. 7,662,535 (Yang et al.). The more desirable shape control agents are polyethyloxazoline, fatty acid modified polyesters such as EFKA° 6225 and EFKA° 6220 from Ciba BASF, and phosphate esters of alkoxylated phenols such as SynFac® 8337.

Chemically-crosslinked organic porous particles that are not perfectly spherical can have an aspect ratio of less than 0.95 and typically less than 0.9 and as low as 0.1.

It should be understood from the description for providing chemically-crosslinked organic porous particles having first and second discrete particles, that the method for making these particles can be modified or expanded to incorporate additional discrete pores. To accomplish this, for example, the method described herein can further comprise:

combining one or more additional water-in-oil emulsions, each comprising a pore stabilizing hydrocolloid in one or more additional aqueous phases that are dispersed in one or more additional oil phases each, and each oil phase containing a polyfunctional reactive compound, a reagent that causes crosslinking, optionally an ethylenically unsaturated polymerizable monomer, and optionally an organic solvent, with the first and second water-in-oil emulsions described above so that the third water-in-oil emulsion contains distinct droplets of the first, second, and the one or more additional aqueous phases.

In some embodiments of this method, at least one of the additional water-in-oil emulsions contains a radiation absorber such as an infrared radiation absorber.

The laser-engraveable layer can further comprise chemically inactive particles or microparticles in an amount of at least 2 weight % and up to and including 50 weight %, or typically at least 5 weight % and up to and including 25 weight %, based on total dry laser-engraveable layer weight. The term "inactive" means that the particles or microparticles are chemically inert and do not chemically react with the polymeric binders or radiation absorbers. In addition, these inactive particles or microparticles do not contain radiation absorbers and do not absorb the laser radiation. However, their presence can reinforce the mechanical properties of the laser-engraveable layer, increase the hardness of the laser-engraveable layer, or decrease its tackiness and ablation debris, enabling easier debris collection and improving the cleanliness of the laser-engraved flexographic printing member.

Inactive inorganic particles include various inorganic filler materials including but not limited to, silica, titanium dioxide, and alumina, and particles such as fine particulate silica, fumed silica, porous silica, barium sulfate, calcium carbonate, calcium sulfate, zinc oxide, mica, talc (magnesium silicate hydrate), surface treated silica (sold as Aerosil from Degussa and Cab-O-Sil from Cabot Corporation), zeolites, and silicate minerals and clays such as bentonite, montmorillonite, and kaolinite, aluminum silicates, halloysite and hallosite nanotubes, and micropowders such as amorphous magnesium silicate cosmetic microspheres sold by Cabot and 3M Corporation.

Optional addenda in the laser-engraveable layer can also include but are not limited to, non-porous polymeric particles, plasticizers, colorants such as dyes and pigments, antioxidants, antiozonants, stabilizing compounds, dispersing aids, surfactants, thickening agents, and adhesion promoters, as long as they do not interfere with laser-engraving efficiency. Examples of plasticizers can include low molecular weight polyolefins, polyesters, or polyacrylates, fluorinated compounds, silicone compounds, un-crosslinked liquid rubbers and oils, liquid ethylene-propylene, liquid polybutene, liquid polyisoprene, liquid polypropylene, or mixtures of these.

The crosslinked organic porous particles useful in this invention are generally insoluble in propyl acetate for 24 hours at room temperature (from 20 to 25° C.) whereas the polyfunctional reactive compounds used to make the crosslinked porous particles are generally soluble in propyl acetate under the same conditions. In particular embodiments, the crosslinking is achieved to such an extent that when the crosslinked organic porous particle is subjected to 200° C. and 1500 psi pressure (105.5 kg/cm$^2$) for 5 minutes, the crosslinked organic porous particle recovers at least 80%, and typically at least 95%, of its original volume (before being subjected to this test).

Laser-Engraveable Flexographic Printing Precursors

The laser-engraveable layer can be formed from a formulation comprising one or more elastomeric resins and the chemically-crosslinked, elastomeric, organic, porous particles as described above, and optionally a radiation absorber and other additives, and optionally one or more coating solvents, to provide an elastomeric composition. This formulation can be formed as a self-supporting layer or disposed on a suitable substrate (described below). Such layers can be formed in any suitable fashion, for example by coating, flowing, or pouring a series of formulations onto the substrate by methods known in the art and drying to form a layer, flat or curved sheet, or seamless printing sleeve. Alternatively, the formulations can be press-molded, injection-molded, melt extruded, co-extruded, or melt calendared into an appropriate layer or ring (sleeve) and optionally adhered or laminated to a substrate and cooled to form a layer, flat or curved sheet, or seamless printing sleeve. Alternatively, the laser-engraveable layer can be crosslinked or vulcanized during the manufacturing process by commonly known methods. The flexographic printing precursors in sheet-form can be wrapped around a printing cylinder and optionally fused at the edges to form a seamless printing sleeve precursor.

The laser-engraveable flexographic printing precursors can include a self-supporting laser-engraveable layer (defined above). This type of laser-engraveable layer does not need a separate substrate to have physical integrity and strength. In such embodiments, the laser-engraveable layer is thick enough and laser engraving is controlled in such a manner that the relief image depth is less than the entire thickness, for example up to 80% of the entire thickness of the layer.

The total dry thickness of the flexographic printing plate precursors of this invention is at least 500 μm and up to and including 6,000 μm or typically at least 1,000 μm and up to and including 3,000 μm. As noted above, all of this thickness can be composed of the laser-engraveable layer, but when a substrate or other layers are present, the laser-engraveable layer dry thickness is typically at least 10% and up to and including 95% of the total dry precursor thickness. Flexographic printing sleeve precursors can generally have a laser-engraveable layer of at least 2 mm and up to and including 20 mm. Flexographic printing cylinders would also have a suitable laser-engraveable layer thickness.

Multiple layers of the laser-engraveable layer (described above) can be disposed one on top of the other in order to create a thicker laser-engravable layer. These layers can be identical, or can differ in composition in that they contain differing amounts and types of additives (for example porous particles, radiation absorbers, and elastomeric resins).

However, in other embodiments, the laser-engraveable flexographic printing precursors include a suitable dimensionally stable, non-laser-engraveable substrate having an imaging side and a non-imaging side. The substrate has at least one laser-engraveable layer (described above) disposed over the substrate on the imaging side. In most embodiments, the laser-engraveable layer is disposed directly on the substrate. Suitable substrates include but are not limited to, dimensionally stable polymeric films, aluminum sheets or cylinders, fiberglass forms, transparent forms, ceramics, woven and non-woven fabrics, or laminates of polymeric films (from condensation or addition polymers) and metal sheets such as a laminate of a polyester and aluminum sheet or polyester/polyamide laminates, a laminate of a polyester film and a compliant or adhesive support, or a laminate of a polyester and a woven or non-woven fabric. A polyester, polycarbonate, vinyl polymer, or polystyrene film can be used. Useful polyesters include but are not limited to poly(ethylene terephthalate) and poly(ethylene naphthalate). The substrates can have any suitable thickness, but generally they are at least 0.01 mm or at least 0.05 mm and up to and including 0.3 mm thick (dry thickness), especially for the polymeric substrates, or up to 0.6 mm thick for woven or non-woven fabrics, or laminates of fabrics and polymeric supports. An adhesive layer can be used to secure the elastomeric composition to the substrate. A thin conductive layer or film of, for example, poly(3,4-ethylenedioxythiophene) (PEDOT), polyacetylene, polyaniline, polypyrrole, or polythiophenes, indium tin oxide (ITO), and graphene, can be disposed between the substrate and the laser engravable layer.

There can be a non-laser-engraveable backcoat on the non-imaging side of the substrate that can be composed of a soft rubber or foam, or other compliant layer. This backcoat can be present to provide adhesion between the substrate and the printing press rollers and to provide extra compliance to the resulting flexographic printing member, or to reduce or control the curl of the flexographic printing member. In addition, this backcoat can be reflective of imaging radiation or transparent to it. If desired, the backcoat can also be laser-engravable, either by the same type of laser that is used to engrave the imaging side, or by a different type of laser. This backside laser engraving can be useful to record, for example, specific information or metadata.

The laser-engraveable flexographic printing precursor can contain one or more layers but the simpler precursor consists essentially of only a single laser-engraveable layer. In other embodiments, there can be a non-laser-engraveable elastomeric rubber layer (for example, a cushioning layer) between a substrate and the topmost laser-engraveable layer. In some other embodiments, there can be a capping or smoothing layer that provides additional smoothness or better ink reception disposed over the laser-engraveable layer.

The laser engraveable flexographic printing precursor or patternable material can be prepared in various ways, for example, by coating, flowing, or pouring the laser-engraveable layer formulation onto the substrate out of a suitable solvent and drying. Alternatively, the laser-engraveable layer(s) can be press-molded, injection-molded, melt extruded, extruded then calendered, or co-extruded into an appropriate layer or ring (sleeve) and if desired, adhered or laminated to the substrate to form a continuous layer, flat or curved sheet, or seamless printing sleeve. Alternatively, the laser-engraveable layer can be crosslinked or vulcanized during the manufacturing process by commonly known methods. The layer in sheet-form can be wrapped around a printing cylinder and optionally fused at the edges to form a seamless flexographic printing sleeve.

The laser engraveable flexographic printing precursor can be subjected to mechanical grinding by known methods in the art using commercially available machines such as belt grinders, cylindrical grinders using an abrasive wheel, or abrasive paper. Grinding can be done on either the outermost surface of the laser-engravable layer (referred to as the laser-engraveable surface) or to the surface farthest from the laser-engraveable surface (referred to as the non-laser-engraveable surface) in order to ensure thickness uniformity, or it can be done on the laser-engravable surface to achieve a desired surface roughness that will improve printing ink wetting and transfer.

The laser-engraveable flexographic printing precursor can also be constructed with a suitable protective layer or slip film (with release properties or a release agent) in a cover sheet that is removed prior to laser engraving. Such protective layers can be a polyester film [such as poly(ethylene terephthalate)], a polyethylene or similar film, to form a cover sheet.

Laser-Engraving and Printing

The present invention can be used to provide a relief image in a flexographic printing member by laser-engraving a suitable flexographic printing precursor of this invention using suitable laser-engraving radiation. Such precursors can be used to form flexographic printing plates, flexographic printing sleeves, or flexographic printing cylinders.

Imaging of the flexographic printing precursor to provide the desired relief image can be achieved using one or more suitable laser diodes (for example infrared laser diodes). The resulting flexographic printing member can have a relief image with a geometric feature, or a plurality of relief features, or it can have a relief image that is irregular in shape or appearance. Engraving energy is generally applied using a suitable imaging laser or laser array such as, but not limited to, a gas laser for example $CO_2$ laser, near-infrared lasers such as near-infrared radiation-emitting diodes, arrays of laser diodes, Nd-YAG lasers, fiber semiconductor lasers, fiber-coupled semiconductor laser diodes, or other laser array. Engraving to provide a relief image with a depth of at least 100 µm is desired with a relief image having a maximum depth of from about 300 µm and up to and including 1000 µm being more desirable. It is understood that the depth between image features that are closely spaced will be less than the maximum depth. The relief image can have a maximum depth up to about 100% of the original thickness of the laser-engraveable layer when a substrate or non-engraveable layer is present under the laser-engraveable layer. In such instances, the floor of the relief image can be the substrate if the laser-engraveable layer is completely removed in the imaged regions. If a substrate is not used, the relief image can have a maximum depth up to about 80% of the original thickness of the laser-engraveable layer.

A laser operating at a wavelength of at least 700 nm is generally used, and a laser operating at a wavelength of at least 800 nm and up to and including 1250 nm is particularly useful. The laser should have a high enough intensity that the pulse or the effective pulse caused by relative movement between the laser and the precursor is deposited approximately adiabatically during the pulse. Generally, laser-engraving is achieved using at least one laser providing a minimum fluence level of at least 1 $J/cm^2$ at the precursor topmost surface and typically infrared laser-engraving is carried out at an energy of at least 20 $J/cm^2$ and up to and including 1000 $J/cm^2$ or at least 50 $J/cm^2$ and up to and including 1500 $J/cm^2$. For example, laser-engraving can be carried out using a diode laser, an array of diode lasers connected with fiber optics, a Nd-YAG laser, a fiber laser, a carbon dioxide gas laser, or a semiconductor laser. Such instruments and conditions for their use are well known in the art and readily available from a number of commercial sources. Detailed descriptions can be found in U.S. Patent Application Publications 2010/0068470A1 (Sugasaki), 2008/018943A1 (Eyal et al.), and 2011/0014573A1 (Matzner et al.), all hereby incorporated by reference.

Thus, a system for laser-engraving a flexographic printing plate precursor to form a flexographic printing member can comprise:

a laser-engravable flexographic printing precursor for providing a relief image as described herein, and one or more laser-engraving radiation sources that are directed to provide laser engraving of the laser-engraveable layer. In particular, the laser-engraveable layer comprises an infrared radiation absorber and the one or more laser-engraving radiation sources provide infrared radiation.

This system can further comprise a platform on which the laser-engraveable flexographic printing precursor is mounted for laser-engraving. In addition, in the system, the one or more laser-engraving radiation sources can be selected from the group consisting of laser diodes, multi-emitter laser diodes, laser bars, laser stacks, fiber lasers, and a combination thereof.

Laser-engraving a relief image can occur in various contexts. For example, sheet-like flexographic printing precursors can be imaged and used as desired, or wrapped around a printing cylinder or cylinder form before imaging. The flexographic printing precursor can also be a printing sleeve that can be mounted directly into a laser imaging device.

During imaging, most of the removed products of engraving are combinations of particulate and gaseous or volatile components and are readily collected by vacuum for disposal or chemical treatment. Any residual solid debris on the engraved member can be similarly collected using vacuum or washing.

After imaging, the resulting flexographic printing member can be subjected to an optional detacking step if the elastomeric topmost surface is still tacky, using methods known in the art.

During printing, the resulting flexographic printing member is inked using known methods and the ink is appropriately transferred to a suitable receiver element such as paper, plastics, fabrics, paperboard, or cardboard using a flexographic printing press. Many useful flexographic printing inks are readily available in the art.

If desired, after printing, the imaged printing plate or printing sleeve can be cleaned and the engraved surface melted and recycled (if the laser-engraved layer is suitable for melting and recycling). For example, laser-engraved layers comprising a thermoplastic elastomeric nanocrystalline polyolefin of any laser-engraved flexographic printing member can be melted and recycled before printing for example if a defect is observed in the relief image.

The flexographic printing precursor of this invention can be part of a system that is designed for laser-engraving such flexographic printing plate precursors to form flexographic printing members. Besides the precursors, the system can include, at least, one or more laser-engraving radiation sources that are directed to provide laser engraving of the laser-engraveable layer. Useful laser-engraving sources are described above and additional sources would be readily apparent to one skilled in the art. One useful system is described in U.S. Patent Application Publication 2011/0014573 (noted above) that is incorporated herein by reference. Such laser-engraving system includes one or more laser-engraving radiation sources and particularly two groups of laser-engraving radiation sources.

The system can further comprise a platform on which the laser-engraveable flexographic printing precursor is mounted for laser-engraving. Such platforms can include for example, webs (moving or not moving), cylinders, or rotating drums. The laser-engraving radiation sources (for example, IR radiation sources) can be provided as one or more lasers for example from a hybrid optical imaging head having at least two groups of radiation sources as described for example in U.S. Patent Application Publication 2008/0153038 (Siman-Tov et al.), incorporated herein by reference, that are controlled using suitable control devices.

The one or more laser-engraving radiation sources can be selected from the group consisting of laser diodes, multi-emitter laser diodes, laser bars, laser stacks, fiber lasers, and a combination thereof. In particular embodiments, the laser-engraveable layer of the precursor comprises an infrared radiation absorber and the one or more laser-engraving radiation sources provide infrared radiation.

Other systems for providing relief images by laser-engraving are described for example in U.S. Pat. Nos. 6,150,629 (Sievers) and 6,857,365 (Juffinger et al.) and in U.S. Patent Application Publications 2006/0132592 (Sievers), 2006/0065147 (Ogawa), 2006/0203861 (Ogawa), and 2008/0153038 (noted above), 2008/018943A1 (noted above), and 2011/0014573A1 (noted above).

The present invention provides at least the following embodiments and combinations thereof, but other combinations of features are considered to be within the present invention as a skilled artisan would appreciate from the teaching of this disclosure:

1. A laser-engraveable composition comprising a laser-engraveable resin having chemically-crosslinked organic porous particles dispersed therein.
2. The composition of embodiment 1 further comprising a radiation absorber.
3. The composition of embodiment 1 or 2 further comprising an infrared radiation (IR) absorber.
4. The composition of any of embodiments 1 to 3 wherein the chemically-crosslinked organic porous particles comprise a radiation absorber.
5. The composition of any of embodiments 1 to 4 wherein the chemically-crosslinked organic porous particles comprise an infrared radiation absorber.
6. The composition of any of embodiments 1 to 5 further comprising a conductive or non-conductive carbon black, IR-absorbing dye or pigment, iron oxide, carbon nanotubes, or graphene.
7. The composition of any of embodiments 1 to 6 wherein the chemically-crosslinked organic porous particles comprise a carbon black.
8. The composition of any of embodiments 1 to 7 wherein the chemically-crosslinked organic porous particles comprise a carbon black in at least some of their pores.
9. The composition of any of embodiments 1 to 8 wherein the chemically-crosslinked organic porous particles comprise a hydrophobic carbon black.
10. The composition of any of embodiments 1 to 9 wherein the laser-engraveable resin is an elastomeric resin having a glass transition temperature of less than or equal to 20° C.
11. The composition of any of embodiments 1 to 10 wherein the chemically-crosslinked organic porous particles comprise a chemically-crosslinked elastomeric resin that has a glass transition temperature of less than or equal to 20° C.
12. The composition of any of embodiments 1 to 11 comprising the chemically-crosslinked organic porous particles in an amount of at least 5 weight % and up to and including 75 weight %.
13. The composition of any of embodiments 1 to 12 wherein the mode particle size of the chemically-crosslinked organic porous particles is at least 2 µm, the chemically-crosslinked organic porous particles have discrete pores that are isolated from each other and dispersed within a chemically-crosslinked organic solid phase, and the discrete pores have an average size greater than or equal to 0.1 µm.
14. A laser-engravable flexographic printing precursor for providing a relief image, the precursor comprising at least one relief-forming, laser-engravable layer that comprises the laser-engraveable composition of any of embodiments 1 to 13.
15. The precursor of embodiment 14 wherein the laser-engraveable layer further comprises a radiation absorber in an amount of at least 3 weight % based on the total dry weight of the laser-engraveable layer.
16. The precursor of embodiment 14 or 15 wherein the chemically-crosslinked organic porous particles comprise a radiation absorber in an amount of at least 5 weight % based on the total dry weight of the chemically-crosslinked organic porous particles.

17. The precursor of any of embodiments 14 to 16 wherein the laser-engraveable layer further comprises inactive particles in an amount of at least 2 weight %.
18. The precursor of any of embodiments 14 to 17 further comprising a substrate over which the laser-engravable layer is disposed.
19. The precursor of any of embodiments 14 to 18 further comprising at least one layer in addition to the relief-forming laser-engraveable layer.
20. The precursor of any of embodiments 14 to 19 wherein the chemically-crosslinked organic porous particles have outer surfaces that comprise colloidal inorganic particles.
21. A patternable material comprising a relief-forming, laser-engravable layer that comprises the laser-engraveable composition of any of embodiments 1 to 13.
22. A method for providing a relief image in a flexographic printing member by laser engraving, comprising imagewise exposing the laser-engravable flexographic printing precursor of any of embodiments 14 to 20 to laser-engraving radiation to provide a flexographic printing member with a relief image having a maximum dry depth of at least 50 and up to and including 1000 μm.
23. A flexographic printing member provided by the method of embodiment 22, the flexographic printing member comprising a relief image in a laser-engraved layer comprising a laser-engraveable resin having chemically-crosslinked organic porous particles dispersed therein.
24. The flexographic printing member of embodiment 23 wherein the chemically-crosslinked organic porous particles comprise a chemically-crosslinked elastomeric resin that has a glass transition temperature of less than or equal to 20° C.
25. A system for laser-engraving a flexographic printing plate precursor to form a flexographic printing member, the system comprising:
the laser-engravable flexographic printing precursor for providing a relief image of any of embodiments 14 to 20, and
one or more laser-engraving radiation sources that are directed to provide laser engraving of the laser-engraveable layer.

The following Examples are provided to illustrate the practice of this invention and are not meant to be limiting in any manner.

Ethylenically unsaturated polymerizable monomers methyl methacrylate and 2-ethylhexyl methacrylate were obtained from Sigma Aldrich Co.

The prepolymers, CN968, an aliphatic urethane hexaacrylate oligomer and CN301, a mixture of polybutadiene dimethacrylate and 1,6-hexanediol diacrylate esters, were obtained from Sartomer USA, LLC.

Carboxy methylcellulose, MW 250K (CMC), was obtained from Acros Organics or from Ashland Aqualon as Aqualon 9M31F. These were interchangeably used.

The emulsifiers, Tetronic® 150 R1, a tetrafunctional block copolymer with terminal secondary hydroxyl groups, was obtained from BASF Corporation. Polyglycerol polyricinoleate, GRINDSTED® PGPR 90, was obtained from DANISCO®.

Nalco™ 1060 colloidal silica was obtained from Nalco Chemical Company as a 50 weight % aqueous dispersion.

Ludox® TM colloidal silica was obtained from W.R Grace and Co. as a 50 weight % aqueous dispersion.

The initiator, Vazo® 52, 2,2'-azobis(2,4-dimethylvaleronitrile), was obtained from DuPont Company.

A promoter, poly(methylamino ethanol adipate) oligomer (AMAE), that was used to promote the adsorption of silica to droplet surface was prepared by condensation polymerization of amino ethanol and adipic acid.

Potassium dichromate was used to inhibit formation of water soluble polymer and was obtained from Aldrich.

The thermoplastic elastomeric material NOTIO™ was obtained from Mitsui Chemicals American, Inc.

The radiation absorber material used was carbon black. "Millgrinds" were made in ethyl acetate and in water. A hydrophobic carbon black (CB) Toolkit C was obtained from Cabot Corporation. The CB mill grind (CBM) was made in water using Solsperse® 43000 (25 weight % with respect to CB) at 16 weight % pigment. The other was a hydrophobic CB made in-house from surface modification of Regal 330 (Cabot Corporation), the mill grind of which (CBM1) in water was made using Solsperse 43000 (25 weight % with respect to CB) at 12 weight % pigment.

The size and shape of the chemically-crosslinked organic porous particles were measured using a Sysmex FPIA-3000 automated particle shape and size analyzer from Malvern Instruments. In this method, samples were passed through a sheath flow cell that transformed the particle suspension into narrow or flat flow, ensuring that the largest area of the particle is oriented towards the camera and that all particles are in focus. The CCD camera captures 60 images every second and these were analyzed in real time. The reported size of the chemically-crosslinked organic porous particles is the mode value of the particle size distribution where mode represents the size that occurs most frequently.

The porosity of the chemically-crosslinked organic porous particles was measured using mercury intrusion porosimetry and in some cases a time-of-flight measurements. In the latter method, the level of porosity was determined using time-of-flight measurements in combination with a conventional diameter sizing procedure. Conventional sizing methods include total volume displacement methods such as Coulter particle sizers or image based methods such as the Sysmex FPIA3000 system. The time-of-flight measurements used includes the Aerosizer particle measuring system, where the particle sizes by their time-of-flight in a controlled environment. This time of flight depends critically on the density of the material. If the material measured with the Aerosizer has a lower density due to porosity or a higher density due, for example, to the presence of fillers, then the calculated diameter distribution will be shifted artificially low or high respectively. Independent measurements of the true particle size distribution via alternate methods (for example, Coulter or Sysmex) can then be used to fit the Aerosizer data with particle density as the adjustable parameter. The method of determining the extent of particle porosity of the chemically-crosslinked organic porous particles of the present invention is as follows. The outside diameter particle size distribution is first measured using either the Coulter or Sysmex particle measurement systems. The mode of the volume diameter distribution is chosen as the value to match with the Aerosizer volume distribution. The same particle distribution is measured with the Aerosizer and the apparent density of the particles is adjusted until the mode (D50%) of the two distributions matches. The ratio of the calculated and solid particle densities is taken to be the extent of porosity of the particles (1—Aerosizer density/density of solid particle). The calculated porosity values generally have uncertainties of +/−10%.

The chemically-crosslinked organic porous polymer particles used in the Examples were made using the following procedures:

PP1: Chemically-Crosslinked Organic Porous Particles Containing Carbon Black (9.5 weight %) and Discrete Pores A first organic phase (190 g) containing 54 weight % of CN968, 40.6 weight % of methyl methacrylate, 2 weight % of Tetronic° 150R1, and 3.2 weight % of Vazo® 52 was emulsified with the first aqueous phase made up of 89.7 g of CBM1 (containing of 2 weight % of CMC) using the Silverson Mixer followed by homogenization in the Microfluidizer® at 9800 psi (689 kg/cm²). A 170 g aliquot of the first water-in-oil emulsion was added to the third aqueous phase consisting of 236 g of a 200 mmolar citrate phosphate buffer at pH 4 and 16.5 g of Ludox® TM, and was emulsified using the Silverson Mixer fitted with a General-Purpose Disintegrating Head for two minutes at 2000 RPM, followed by homogenization in an orifice disperser at 1000 psi (70.3 kg/cm²) to form a water-in-oil-in-water emulsion. This emulsion was polymerized at 55° C. for 16 hours under nitrogen and then at 70° C. for 4 hours. The resulting spherical chemically-crosslinked organic porous particles were isolated in a fitted glass funnel followed by washing with water and drying. The black-colored chemically-crosslinked organic porous particles had a mode particle size of 9.4 μm and a porosity of 30% by Hg intrusion porosimetry.

PP2: Chemically-Crosslinked Organic Porous Particles Containing Carbon Black (7 weight %) and Discrete Pores A first organic phase (190 g) containing 54 weight % of CN968, 44 weight % of methyl methacrylate, 2 weight % of Tetronic® 150R1, and 3.2 weight % of Vazo® 52 was emulsified with the first aqueous phase made up of 89.7 g of CBM1 (containing of 2 weight % of CMC) using the Silverson Mixer followed by homogenization in the Microfluidizer® at 9800 psi (689 kg/cm²). A 170 g aliquot of the first water-in-oil emulsion was added to the third aqueous phase consisting of 236 g of a 200 mmolar citrate phosphate buffer at pH 4 and 16.5 g of Ludox® TM, and was emulsified using the Silverson Mixer fitted with a General-Purpose Disintegrating Head for two minutes at 2000 RPM, followed by homogenization in an orifice disperser at 1000 psi (70.3 kg/cm²) to form a water-in-oil-in-water emulsion. This emulsion was polymerized at 55° C. for 16 hours under nitrogen and then at 70° C. for 4 hours. The resulting spherical chemically-crosslinked organic porous particles were isolated in a fitted glass funnel followed by washing with water and drying. The black-colored chemically-crosslinked organic porous particles had a mode particle size of 8.2 μm and a porosity of 31% by Hg intrusion porosimetry.

PP3: Chemically-Crosslinked Organic Elastomeric Porous Particles Containing Carbon Black (10 weight %) and Discrete Pores A first organic phase (243.7 g) containing 81 weight % ethyl acetate, 9 weight % of CN301, 9 weight % of 2-ethylhexyl methacrylate, 0.35 weight % of PGPR 90, and 0.54 weight % of Vazo® 52 was emulsified with the first aqueous phase made up of 80 grams of a 3.75 weight % CMC and 41.3 g of CBM1 using the Silverson Mixer followed by homogenization in the Microfluidizer® at 9800 psi (689 kg/cm²). An 250 g aliquot of the first water-in-oil emulsion was added to the third aqueous phase consisting of 400 g of a 200 mmolar citrate phosphate buffer at pH 4, 16 g of Nalco® 1060 and 2 g of a 10 weight % AMAE promoter solution in water, and emulsified using the Silverson Mixer fitted with a General-Purpose Disintegrating Head for two minutes at 2000 RPM, followed by homogenization in an orifice disperser at 1000 psi (70.3 kg/cm²) to form a water-in-oil-in-water emulsion. This emulsion was diluted 1:1 with water followed by addition of 3 ml of a 2.5 weight % solution of potassium dichromate to scavenge water soluble free radicals and polymerized at 55° C. for 1 hour under nitrogen. This was followed by removal of ethyl acetate under reduced pressure using a rotary evaporator. The polymerization was then continued at 55° C. for 16 hours under nitrogen and then at 70° C. for 4 hours. The resulting spherical chemically-crosslinked organic porous particles were isolated in a fritted glass funnel followed by washing with water and drying. The black-colored chemically-crosslinked organic porous particles had a mode size of 6.8 μm, a porosity of 50%, an AR (aspect ratio) of 0.965, and a porosity of 50%. The chemically-crosslinked organic porous particles showed a glass transition temperature of 5° C. by DSC at a heating rate of 5° C./min.

Invention Example 1

Notio™ PN-2060 pellets (26 g, Mitsui Chemicals America, Inc. Rye Brook, N.Y.) were combined with 18.0 grams of crosslinked porous particles PP1 and melt mixed in a Brabender mixer (ATR-2120 equipped with 3 heat zones and high shear roller type blades). This sample was mixed in the Brabender at 220° C. for 10 minutes, removed, and allowed to cool. A sample (2.5 g) of the resulting mixture was introduced into an aluminum mold with 300FN Kapton™ on one side for ease of release, and was pressed into the shape of a flat plate using a Carver press (model #3393), set at 3000 lbs (1360.8 kg) pressure at 220° C. for 5 minutes. The assembly of the mold and the plate was then cold-pressed in another Carver press that was set at 3000 lbs (1360.8 kg) pressure with no heating for 30 minutes. The resulting sample size was 75×75 mm by approximately 0.8 mm thick, forming a laser-engravable flexographic printing plate precursor.

This laser-engravable flexographic printing plate precursor was then imaged using a 5.3 watt, 1064 nm pulsed single mode Ytterbium fiber laser with an 80 μm spot size. The pulse width was approximately 30 nsec and the pulse repetition rate was 20 kHz. The images used were 1 cm×1 cm patches, rastered at 800 dpi at speeds from 13 inches/sec (ips) to 6.5 inch/sec (33.02 cm/sec to 16.5 cm/sec), resulting in corresponding fluences of from 51 J/cm² to 102 J/cm². The depths of the ablated patches were measured using a self non-rotating spindle with ratchet stop micrometer. The value for the relief image depth engraved when the laser fluence was 102 J/cm² was 290 μm.

The molded sample was cryo-sectioned in the thickness direction and examined using a Hitachi S3000H Scanning Electron Microscope (SEM) to determine the integrity of the microparticles after the melt processing and molding step. The results showed that the microparticles remained intact and porous after the melt processing and molding step.

Invention Example 2

Notio™ PN-2060 pellets (26 g) were combined with 18.0 grams of crosslinked porous particles PP2 and melt mixed in a Brabender mixer (ATR-2120 equipped with 3 heat zones and high shear roller type blades) at 220° C. for 10 minutes, removed, and allowed to cool. A sample (2.5 g) of this resulting mixture was molded and laser imaged as described for Invention Example 1. The value for the relief image depth engraved when the laser fluence was 102 J/cm² was 288 μm. Examination of a cryo-section of the sample using the SEM as described for Invention Example 1 showed that the microparticles remained intact and porous after the melt processing and molding step.

Invention Example 3

Notio™ PN-2060 pellets (2.5 g) were combined with 2.5 grams of crosslinked porous particles PP3 and melt mixed and extruded in a Minilab Rheomix CTW5 (a table-top twin-screw extruder made by Thermo Haake, N.J.) at 200° C. for 5 minutes, removed, and allowed to cool. The cooled sample was molded and laser imaged as described for Invention Example 1. Examination of a cryo-section of the sample using the SEM as described for Invention Example 1 showed that the microparticles remained intact and porous after the melt processing and molding step.

Invention Example 4

A dispersion was prepared by mixing PP2 powder (2.27 g) with water (5.73 g) for 3 hours. This dispersion was added to 8.62 g of Butanol NX-1138 (65 weight % solids dispersion in water of Styrene/Butadiene [S/B] latex from BASF Corp. Florham, N.J.) and stirred for 30 minutes. The resulting mixture was cast into a Teflon mold that was 10 cm in diameter and covered loosely to allow for evaporation of the water. The sample was dried for 5 days at ambient temperature. The resulting sample size was 10 cm in diameter by approximately 1 mm thick, forming a laser-engravable flexographic printing plate precursor. The dried sample was laser imaged as described for Invention Example 1. Examination of a cryo-section of the sample using the SEM as described for Invention Example 1 showed that the microparticles remained intact and porous. The value for the relief image depth engraved when lazing the top of the sample when the laser fluence was 102 J/cm² was 312 µm.

Invention Example 5

A dispersion was prepared by mixing PP2 powder (5.30 g) with water (13.37 g) for 3 hours. This dispersion was added to 3.69 g of Butanol NX-1138 (65 weight % solids dispersion in water of S/B latex from BASF Corp. Florham, N.J.) and stirred for 30 minutes. The resulting mixture was cast into a Teflon mold and dried as described for Invention Example 4. The resulting sample size was 10 cm in diameter by approximately 1 mm thick, forming a laser-engravable flexographic printing plate precursor. The dried sample was laser imaged as described for Invention Example 1. Examination of a cryo-section of the sample using the SEM as described for Invention Example 1 showed that the microparticles remained intact and porous. The value for the relief image depth engraved when lazing the top of the sample when the laser fluence was 102 J/cm² was 412 µm.

Comparative Example 1

Notio™ PN-2060 pellets (37.2 g) were combined with 1.3 grams of 461DE 12 (hollow microspheres from Expancel®, Duluth, Ga., 100% solids) in a Brabender mixer (ATR-2120 equipped with 3 heat zones and high shear roller type blades) at 220° C. Upon addition of the Expancel® microspheres to the clear molten Notio™ PN-2060 decomposition of the microspheres began and the mixture started smoking and turned dark brown. The 1.4 grams of Mogul® L carbon black were not added at this point and sample preparation was aborted. The 461 DE 12 Expancel® beads did not withstand the heat and high shear necessary for melt processing. This was verified by cryo-sectioning the resulting sample in the thickness direction and examining using a Hitachi S3000H Scanning Electron Microscope (SEM) as described in Invention Example 1 to determine the integrity of the microparticles. These beads were totally collapsed.

Comparative Example 2

Notio™ PN-2060 pellets (36 g) were combined with 2.3 grams of carbon black powder (Mogul L from Cabot Corp Boston, Mass.) and melt mixed in a Brabender mixer (ATR-2120 equipped with 3 heat zones and high shear roller type blades) at 200° C. for 7 minutes, removed, and allowed to cool. A sample (2.5 g) of this mixture was molded and laser imaged as described for Invention Example 1. The value for the relief imaged depth engraved when the laser fluence was 102 J/cm² was 240 µm.

Comparative Example 3

A sample (9.0 g) of a 65 weight % solids dispersion in water of S/B latex (Butonal NX-1138 from BASF Corp. Florham, N.J.) was mixed with 0.59 g of Mogul® L (a carbon black from Cabot Corp Boston, Mass., 100% solids) and 0.13 g of XL-706 (a trifunctional aziridine from Picassian Polymers Peabody, Mass., 100% solids) and stirred for 30 minutes at room temperature. The resulting mixture was cast into a Teflon mold and dried as described for Invention Example 4. The dried sample laser imaged as described for Invention Example 1. The value for the relief image depth engraved when the laser fluence was 102 J/cm² was 248 µm.

These results demonstrated that incorporation of crosslinked porous organic particles into a laser engravable element results in increased laser ablation efficiency. In addition, the crosslinked porous organic particles useful in this invention can be melt-processed at temperatures and pressures needed to melt process thermoplastic elastomers and thermoplastics useful in preparing laser engravable elements and flexographic printing plate precursors, whereas other porous organic particles described in the literature do not survive typical melt processing. In addition, the crosslinked porous organic particles used in this invention can be combined with other components that are in the form of aqueous dispersions and the laser-engraveable precursors can be prepared from these components using environmentally friendly techniques.

The invention has been described in detail with particular reference to certain preferred embodiments thereof, but it will be understood that variations and modifications can be effected within the spirit and scope of the invention.

The invention claimed is:

1. A laser-engraveable composition comprising a laser-engraveable resin having chemically-crosslinked organic porous particles dispersed therein,
wherein the chemically-crosslinked organic porous particles comprise a chemically-crosslinked elastomeric resin that has a glass transition temperature of less than or equal to 20° C.

2. The composition of claim 1 further comprising a radiation absorber.

3. The composition of claim 1 further comprising an infrared radiation (IR) absorber.

4. The composition of claim 1 wherein the chemically-crosslinked organic porous particles comprise a radiation absorber.

5. The composition of claim 1 wherein the chemically-crosslinked organic porous particles comprise an infrared radiation absorber.

6. The composition of claim 1 further comprising a conductive or non-conductive carbon black, IR-absorbing dye or pigment, iron oxide, carbon nanotubes, or graphene.

7. The composition of claim 1 wherein the chemically-crosslinked organic porous particles comprise a carbon black.

8. The composition of claim 1 wherein the chemically-crosslinked organic porous particles comprise a carbon black in at least some of their pores.

9. The composition of claim 1 wherein the chemically-crosslinked organic porous particles comprise a hydrophobic carbon black.

10. The composition of claim 1 wherein the laser-engraveable resin is an elastomeric resin having a glass transition temperature of less than or equal to 20° C.

11. The composition of claim 1 comprising the chemically-crosslinked organic porous particles in an amount of at least 5 weight % and up to and including 75 weight %.

12. The composition of claim 1 wherein the mode particle size of the chemically-crosslinked organic porous particles is at least 2 μm, the chemically-crosslinked organic porous particles have discrete pores that are isolated from each other and dispersed within a chemically-crosslinked organic solid phase, and the discrete pores have an average size greater than or equal to 0.1 μm.

13. A laser-engravable flexographic printing precursor for providing a relief image, the precursor comprising at least one relief-forming, laser-engravable layer that comprise a laser-engraveable resin having chemically-crosslinked organic porous particles dispersed therein,
wherein the chemically-crosslinked organic porous particles comprise a chemically-crosslinked elastomeric resin that has a glass transition temperature of less than or equal to 20° C.

14. The precursor of claim 13 wherein the laser-engraveable layer further comprises a radiation absorber in an amount of at least 3 weight % based on the total dry weight of the laser-engraveable layer.

15. The precursor of claim 13 wherein the chemically-crosslinked organic porous particles comprise a radiation absorber in an amount of at least 5 weight % based on the total dry weight of the chemically-crosslinked organic porous particles.

16. The precursor of claim 13 further comprising a conductive or non-conductive carbon black, IR-absorbing dye or pigment, iron oxide, carbon nanotubes, or graphene.

17. The precursor of claim 13 wherein the chemically-crosslinked organic porous particles are present in the laser-engraveable layer in an amount of at least 5 weight % and up to and including 75 weight %.

18. The precursor of claim 13 wherein the laser-engraveable resin is an elastomeric resin having a glass transition temperature of less than or equal to 20° C.

19. The precursor of claim 13 wherein the mode particle size of each of the chemically-crosslinked organic porous particles is at least 2 μm, the chemically-crosslinked organic porous particles have discrete pores that are isolated from each other and dispersed within a chemically-crosslinked organic solid phase, and the discrete pores have an average size greater than or equal to 0.1 μm.

20. The precursor of claim 13 wherein the laser-engraveable layer further comprises inactive particles in an amount of at least 2 weight %.

21. The precursor of claim 13 further comprising a substrate over which the laser-engravable layer is disposed.

22. The precursor of claim 13 further comprising at least one layer in addition to the relief-forming laser-engraveable layer.

23. The precursor of claim 13 wherein the chemically-crosslinked organic porous particles have outer surfaces that comprise colloidal inorganic particles.

24. A method for providing a relief image in a flexographic printing member by laser engraving, comprising imagewise exposing the laser-engravable flexographic printing precursor of claim 13 to laser-engraving radiation to provide a flexographic printing member with a relief image having a maximum dry depth of at least 50 and up to and including 1000 μm.

25. A flexographic printing member provided by the method of claim 24, the flexographic printing member comprising a relief image in a laser-engraved layer comprising a laser-engraveable resin having chemically-crosslinked organic porous particles dispersed therein.

26. The flexographic printing member of claim 25 wherein the laser-engraved layer further comprises a conductive or non-conductive carbon black, IR-absorbing dye or pigment, iron oxide, carbon nanotubes, or graphene as an infrared radiation absorber.

27. A system for laser-engraving a flexographic printing plate precursor to form a flexographic printing member, the system comprising:
the laser-engravable flexographic printing precursor for providing a relief image of claim 13, and
one or more laser-engraving radiation sources that are directed to provide laser engraving of the laser-engraveable layer.

28. A patternable material comprising a relief-forming, laser-engravable layer that comprises a laser-engraveable elastomeric resin having chemically-crosslinked organic porous particles and an infrared radiation absorber dispersed therein,
wherein the chemically-crosslinked organic porous particles comprise a chemically-crosslinked elastomeric resin that has a glass transition temperature of less than or equal to 20° C.

* * * * *